(12) United States Patent
Ikriannikov

(10) Patent No.: US 12,185,454 B2
(45) Date of Patent: Dec. 31, 2024

(54) CIRCUIT ASSEMBLIES INCLUDING METALLIC BARS

(71) Applicant: Maxim Integrated Products, Inc., San Jose, CA (US)

(72) Inventor: Alexandr Ikriannikov, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 731 days.

(21) Appl. No.: 17/225,875

(22) Filed: Apr. 8, 2021

(65) Prior Publication Data

US 2021/0392745 A1 Dec. 16, 2021

Related U.S. Application Data

(60) Provisional application No. 63/037,129, filed on Jun. 10, 2020.

(51) Int. Cl.
*H05K 1/02* (2006.01)
*H01L 23/498* (2006.01)
*H05K 1/18* (2006.01)

(52) U.S. Cl.
CPC ...... *H05K 1/0265* (2013.01); *H01L 23/49811* (2013.01); *H01L 23/49822* (2013.01); *H01L 23/49838* (2013.01); *H05K 1/0271* (2013.01); *H05K 1/181* (2013.01); *H05K 2201/093* (2013.01); *H05K 2201/10015* (2013.01); *H05K 2201/1003* (2013.01)

(58) Field of Classification Search
None
See application file for complete search history.

(56) References Cited

U.S. PATENT DOCUMENTS

| | | |
|---|---|---|
| 3,693,118 A | 9/1972 | Presser |
| 6,346,743 B1 | 2/2002 | Figueroa et al. |
| 8,373,252 B1 | 2/2013 | DeBaets |
| 9,247,647 B1* | 1/2016 | Yoon .................... H01F 17/0006 |
| 2009/0219669 A1* | 9/2009 | Lai .......................... H01G 4/228 |
| | | 361/306.3 |
| 2013/0094122 A1* | 4/2013 | Domes ................. H05K 7/1432 |
| | | 361/321.1 |
| 2016/0352244 A1* | 12/2016 | Cheng ................. H01L 23/3735 |
| 2018/0184524 A1* | 6/2018 | Xiong ............... H01L 23/49822 |
| 2018/0270946 A1* | 9/2018 | Ito ......................... H05K 1/0206 |
| 2020/0113059 A1* | 4/2020 | Xiong .................... H05K 3/284 |

* cited by examiner

*Primary Examiner* — Sue A Purvis
*Assistant Examiner* — Carnell Hunter, III
(74) *Attorney, Agent, or Firm* — PdZ Patent Law, PLLC

(57) ABSTRACT

A circuit assembly includes a first substrate including a first outer surface, a first capacitor disposed on the first outer surface, and a first metallic bar. The first capacitor has a first capacitor thickness in a first direction orthogonal to the first outer surface. The first metallic bar has a first bar thickness in the first direction, the first bar thickness being greater than the first capacitor thickness. An electrical load is optionally disposed on a second outer surface of the first substrate over the first metallic bar, in the first direction. The electrical load may be electrically coupled to the first metallic bar.

15 Claims, 30 Drawing Sheets

CIRCUIT ASSEMBLIES INCLUDING METALLIC BARS

RELATED APPLICATIONS

This application claims benefit of priority to U.S. Provisional Patent Application Ser. No. 63/037,129, filed on Jun. 10, 2020, which is incorporated herein by reference.

BACKGROUND

Circuit assemblies are widely used in electronic devices. A circuit assembly includes a substrate, such as a printed circuit board (PCB), with components, such as integrated circuits and passive components, attached to one or more outer surfaces of the substrate. The substrate commonly includes metallic conductors, sometimes referred to as "traces," for electrically connecting the components on the substrate. One example of a circuit assembly is an information technology device "motherboard," which includes a processor and supporting components attached to a substrate.

DETAILED DESCRIPTION OF THE EMBODIMENTS

Figure 1:
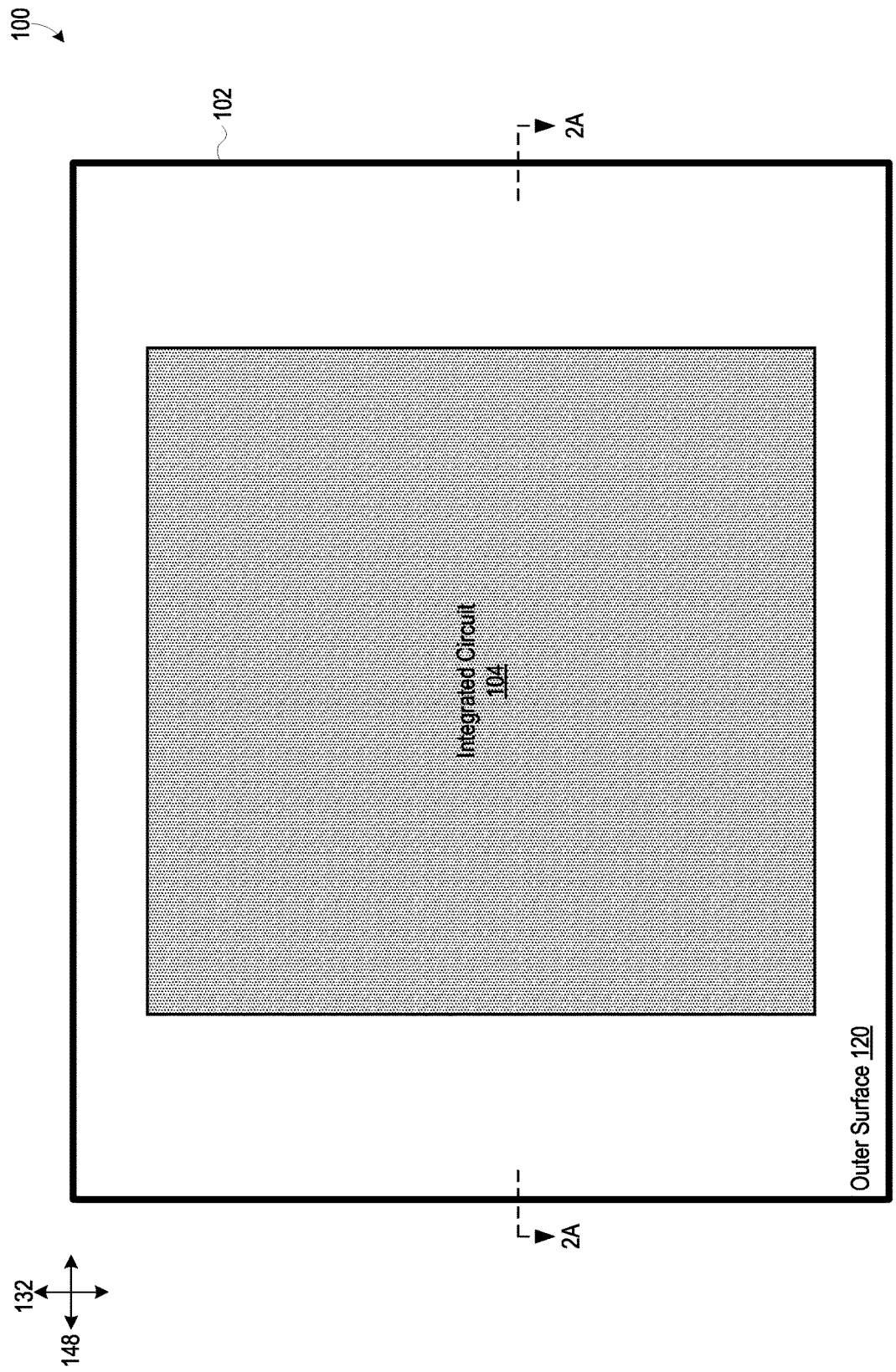
FIG. 1 is a top plan view of a circuit assembly, according to an embodiment.

Circuit assembly substrates often must carry current of significant magnitude. For example, modern integrated circuits may demand 1,000 amperes or more from a power supply rail, and even relatively small substrate resistance may therefore cause significant power loss. Furthermore, integrated circuits often have very tight voltage regulation requirements, which may be difficult to maintain due to large power supply current magnitude interacting with substrate parasitic impedance. Therefore, it is important that substrate power supply paths have low impedance. However, it is often difficult to achieve sufficiently low impedance due to substrate manufacturing and cost limitations. Such difficulty is frequently compounded by presence of signal traces and vias on the substrate, which limits available surface area for power supply conductors on the substrate.

Power supply conductor impedance decreases with decreasing conductor length. Therefore, power supply conductor impedance can be minimized by locating power supply circuitry, such as a direct-current (DC) to direct-current (DC) converter, as close to its load as possible. For example, assume a DC-to-DC converter powers an integrated circuit disposed on a top outer surface of a substrate. Length of power supply conductors between the DC-to-DC converter and the integrated circuit can be minimized by locating the DC-to-DC converter on a bottom outer surface of the substrate, such that the DC-to-DC converter is directly under the integrated circuit. However, this DC-to-DC converter location has significant drawbacks which may make the location impractical.

For example, there are often severe component height restrictions on a substrate bottom outer surface, which may make it difficult to design a suitable DC-to-DC converter, especially when high power conversion efficiency is required. Additionally, the DC-to-DC converter may need to handle significant mechanical pressure applied to the circuit assembly for balancing pressure applied to a heatsink over the substrate top surface (discussed below), which may further complicate DC-to-DC converter design. Moreover, power supply bypass capacitors generally need to be located under the integrated circuit for best performance, which may leave little surface area for DC-to-DC converter components. Moreover, locating a DC-to-DC converter under an integrated circuit may present circuit assembly manufacturing difficulties.

Another challenge faced when designing a circuit assembly is removal of heat from integrated circuits and other components attached to the substrate. Modern integrated circuits may dissipate significant power therein, which necessitates use of a heatsink to remove heat from the integrated circuit. The heatsink must be tightly attached to a thermal interface of the integrated circuit, to enable the heatsink to draw heat from the integrated circuit. Consequently, significant pressure per unit area must be applied to the heatsink and integrated circuit to ensure sufficiently low thermal impedance between the two devices. Such pressure may cause substrate bending and associated damage, as well as possible damage to the integrated circuit itself. Therefore, counter pressure is often applied to the substrate opposite the integrated circuit, to prevent substrate bending and associated damage. This counter pressure, though, complicates reliable placement of components on the substrate opposite the integrated circuit. For example, counter pressure applied to components, such as capacitors, on a substrate bottom outer surface may damage the components.

Disclosed herein are circuit assemblies which may at least partially overcome one or more the above-discussed difficulties associated with conventional circuit assemblies. The new circuit assemblies include one or more electrically conductive structures (e.g., conductive bars or metallic bars). The one or more electrically conductive structures will hereinafter be referred to as metallic bars. The metallic bars may be disposed on a first outer surface of a substrate, such as under an integrated circuit disposed on an opposing second outer surface of the substrate. As discussed further below, the metallic bars may achieve significant advantages. For example, in some embodiments, the metallic bars are thicker than other components, such as capacitors, disposed on the first outer surface. Consequently, the metallic bars receive pressure exerted on the circuit assembly, such as to balance pressure applied to a heatsink above the second outer surface, thereby protecting the components from mechanical pressure. As another example, in some embodiments, the metallic bars serve as power supply conductors, thereby helping achieve low impedance between power supply circuitry and an electrical load powered by the power supply circuitry, even if the power supply circuitry is located a significant distance from the electrical load. Additionally, in some embodiments, the metallic bars are part of the same electrical nodes as other components located on the first outer surface, thereby enabling the metallic bars to be placed close to the components without danger of detrimental electrical shorting between the components and the metallic bars.

Figure 2:
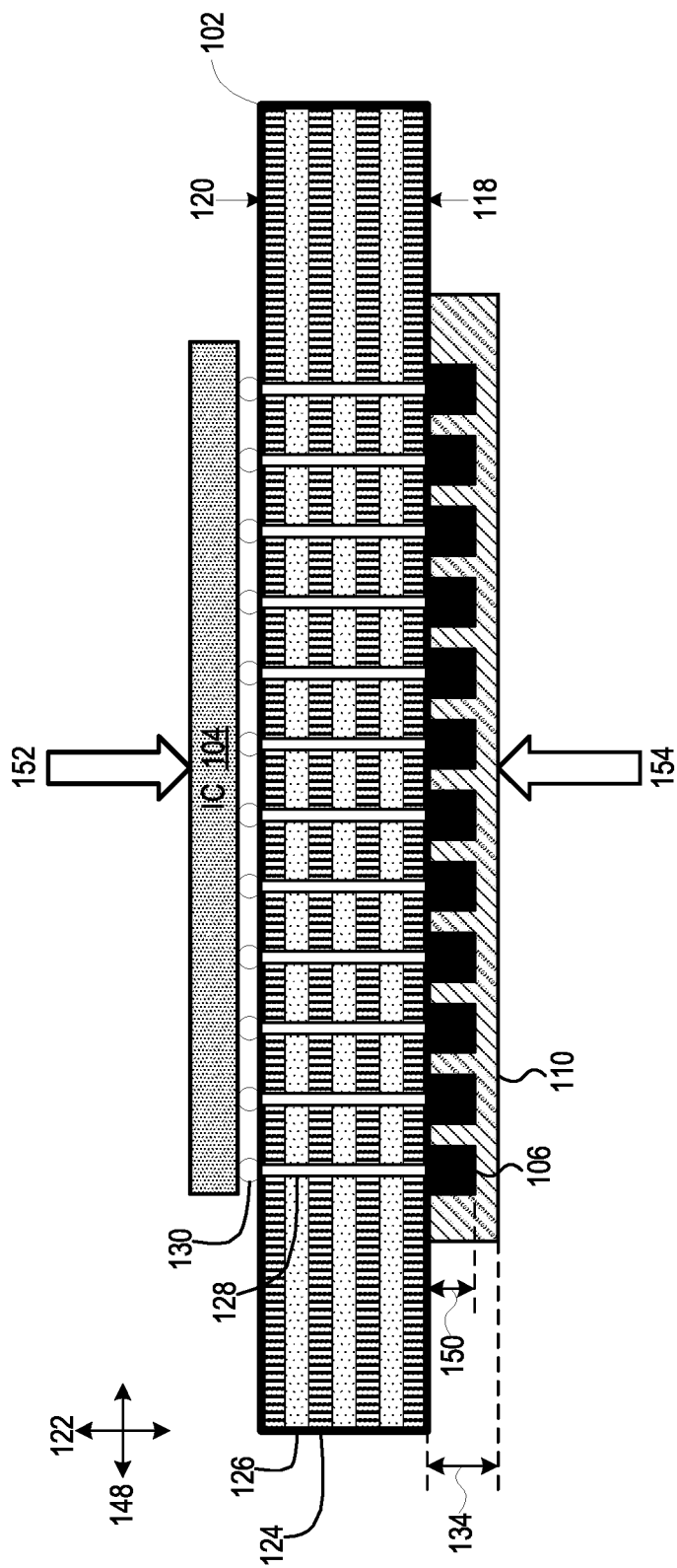
FIG. 2 is a cross-sectional view of the FIG. 1 circuit assembly.
Figure 3:
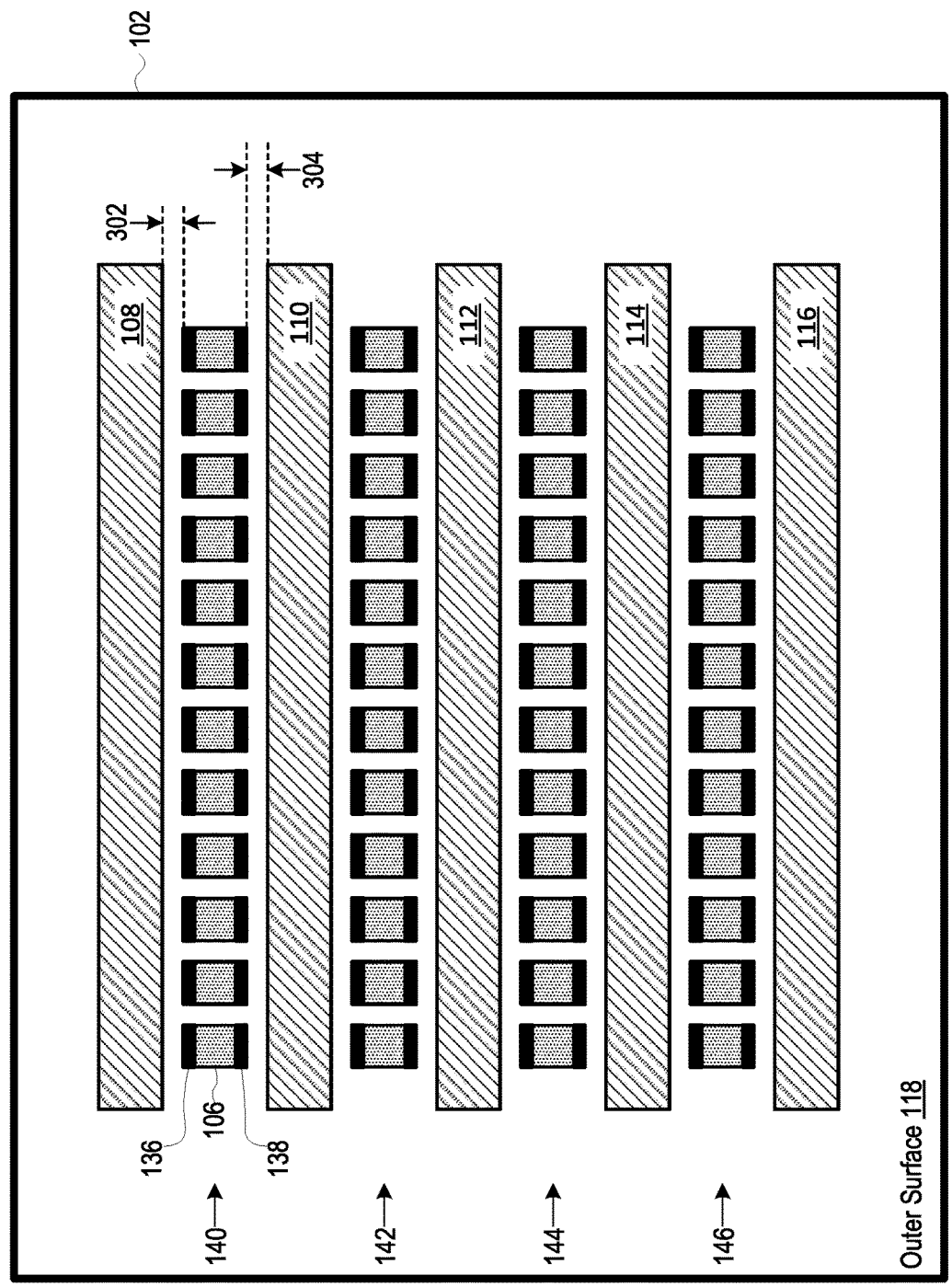
FIG. 3 is a bottom plan view of the FIG. 1 circuit assembly.

FIG. 1 is a top plan view of a circuit assembly 100, which is one embodiment of the new circuit assemblies including metallic bars. FIG. 2 is a cross-sectional view of circuit assembly 100 taken along line 2A-2A of FIG. 1, and FIG. 3 is a bottom plan view of circuit assembly 100. Circuit assembly 100 includes a substrate 102, an electrical load 104, a plurality of capacitors 106, and metallic bars 108-116.

Substrate 102 includes an outer surface 118 and an opposing outer surface 120 separated from each other in a direction 122, where direction 122 is orthogonal to outer surfaces 118 and 120. Substrate 102 is a PCB including a plurality of metallic layers 124, or a plurality of layers formed of another conductive material, separated from each other in direction 122 by a plurality of insulating layers 126 (FIG. 2). Only one metallic layer 124 and one insulating layer 126 are labeled in FIG. 2 for illustrative clarity. Metallic layers 124 are formed, for example, of copper, gold, silver, or aluminum, and insulating layers 126 are formed, for example, of glass fiber reinforced epoxy resin or paper reinforced phenolic resin. The number of metallic layers 124 and number of insulating layers 126 may vary without departing from the scope hereof. Details of metallic layers 124 are not shown, but one or more metallic layers 124 may be patterned to form a plurality of electrical conductors, such as signal traces. Additionally, one or more metallic layers 124 may form a power plane or a ground plane.

Substrate 102 further includes vias 128 which electrically connect two or more different metallic layers 124 in direction 122 (FIG. 2). Only one via 128 is labeled for illustrative clarity. Although vias 128 are illustrated as extending through the entirety of substrate 102 in direction 122, one or more vias 128 could alternately extend through only a portion of substrate 102 in direction 122. The number of vias 128 may vary without departing from the scope hereof. Additionally, the size of substrate 102 could vary from what is illustrated in FIGS. 1-3. For example, substrate 102 may larger than illustrated in FIG. 1-3, such as to accommodate additional components. Furthermore, substrate 102 could alternately be a circuit board other than a PCB, as long as substrate 102 includes outer surfaces for housing components and provisions for electrically connecting the components.

Electrical load 104 is disposed on outer surface 120 of substrate 102. Although electrical load 104 is illustrated as being an integrated circuit connected to substrate 102 via solder balls 130 (only one of which is labeled), electrical load 104 could take other forms without departing from the scope hereof. For example, electrical load 104 could be one or more discrete electrical components in place of an integrated circuit. One or more heatsinks (not shown) are optionally affixed to electrical load 104. Metallic bars 108-116 are disposed on outer surface 118, and in some embodiments, electrical load 104 is disposed over at least a portion of one or more of metallic bars 108-116 in direction 122. Electrical load 104 is optionally electrically coupled to one or more of metallic bars 108-116. Metallic bars 108-116 are separated from each other in a direction 132 (FIG. 3), where direction 132 is orthogonal to direction 122. Each metallic bar 108-116 has a bar thickness 134 in direction 122 (FIG. 2). Bar thickness 134 need not be uniform across all metallic bar 106-116 instances. In some embodiments, metallic bars 108-116 are formed of copper, gold, silver, aluminum, steel, or a metallic alloy.

Capacitors 106 are also disposed on outer surface 118 (FIGS. 2 and 3). Each capacitor 106 has a respective first terminal 136 and a respective second terminal 138, for providing electrical interface to the capacitor. Only one instance of capacitor 106 and its respective terminals 136, 138 are labeled for illustrative clarity. Capacitors 106 are disposed in rows 140-146, where each row is separated from each other row in direction 132, and where each row is bounded in direction 132 by a respective pair of metallic bars 108-116. Capacitors 106 within a given row 140-146 are separated from each other in a direction 148 which is orthogonal to each of directions 122 and 132. Each capacitor 106 has a capacitor thickness 150 in direction 122 (FIG. 2). Capacitor thickness 150 need not be uniform across all capacitor 106 instances.

In certain embodiments, bar thickness 134 is greater than capacitor thickness 150, such as illustrated in FIG. 2. This configuration advantageously helps protect capacitors 106 from mechanical damage. For example, consider a scenario depicted in FIG. 2 where opposing mechanical forces 152 and 154 are applied to circuit assembly 100 in direction 122. Mechanical force 152 is applied, for example, to ensure that a heatsink (not shown) is securely attached to electrical load 104, and opposing mechanical force 154 is applied to counteract mechanical force 152. The relatively large thickness 134 of metallic bars 106-116 causes the metallic bars, instead of capacitors 106, to receive mechanical force 154, thereby protecting capacitors 106 from damage from mechanical force 154.

Figure 4:
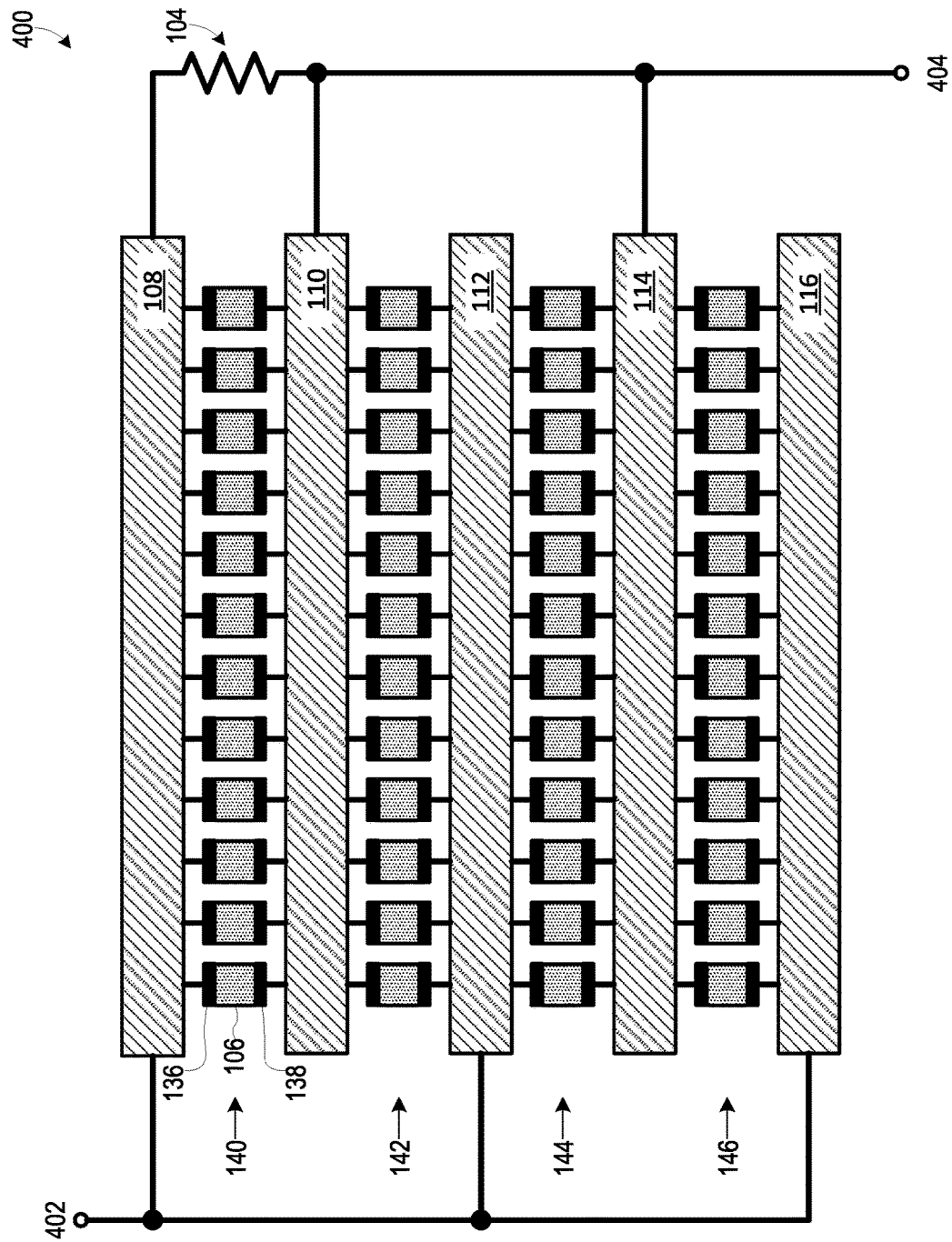
FIG. 4 is an electrical schematic diagram of one embodiment of the FIG. 1 circuit assembly.

In some embodiments, one or more of metallic bars 108-116 serve as power supply conductors, such as to supply electrical power to electrical load 104. For example, FIG. 4 is an electrical schematic diagram 400 of one embodiment of circuit assembly 100 where metallic bars 108-116 serve as power supply conductors. In this embodiment, metallic bars 108, 112, and 116 are electrically coupled to an electrical node 402, and metallic bars 110 and 114 are electrically coupled to an electrical node 404. Electrical load 104 is electrically coupled between electrical nodes 402 and 404. Electrical node 402 is, for example, a power supply node, and electrical node 404 is, for example, a reference node, such that metallic bars 108-116 are alternately connected to a power supply node and a reference node. The potentially large bar thickness 134 of metallic bars 108-116 advantageously enables the metallic bars to provide a low-impedance electrical path between power supply circuitry (not shown) and electrical load 104, even if the power supply circuitry is distant from electrical load 104.

Additionally, in embodiments where circuit assembly 100 has the topology of schematic 400, each capacitor 106 is electrically coupled between nodes 402 and 404. For example, in row 140, capacitor terminals 136 are electrically coupled to metallic bar 108, and capacitor terminals 138 are electrically coupled to metallic bar 110, such that each capacitor 106 in row 140 is electrically coupled between electrical nodes 402 and 404. This configuration advantageously enables capacitors 106 to be placed physically close to metallic bars 108-116 without danger of detrimental electrical shorting between capacitors 106 and metallic bars 108-116. For example, referring again to FIG. 3, assume that the labeled instance of capacitor 106 has its terminals 136 and 138 electrically coupled metallic bars 108 and 110, respectively. A separation distance 302 between terminal 136 and metallic bar 108 can be very small without danger of detrimental electrical shorting between terminal 136 and metallic bar 108 because the terminal and metallic bar are already electrically shorted, i.e. they are part of a common electrical node. Similarly, a separation distance 304 between terminal 138 and metallic bar 110 can be very small without danger of detrimental electrical shorting between terminal 138 and metallic bar 110 because the terminal and metallic bar are already shorted, i.e. they part of a common electrical node. Accordingly, capacitors 106 and metallic bars 108-116 can be placed close together in direction 132 without danger of detrimental electrical shorting, thereby helping achieve dense component placement on outer surface 118. Furthermore, capacitors 106 in a row 140, 142, 144, or 146 can be placed close together in direction 148 without danger of detrimental electrical shorting, because all capacitors of the row are electrically coupled to the same electrical nodes, thereby further helping achieve dense component placement on outer surface 118.

Figure 5:
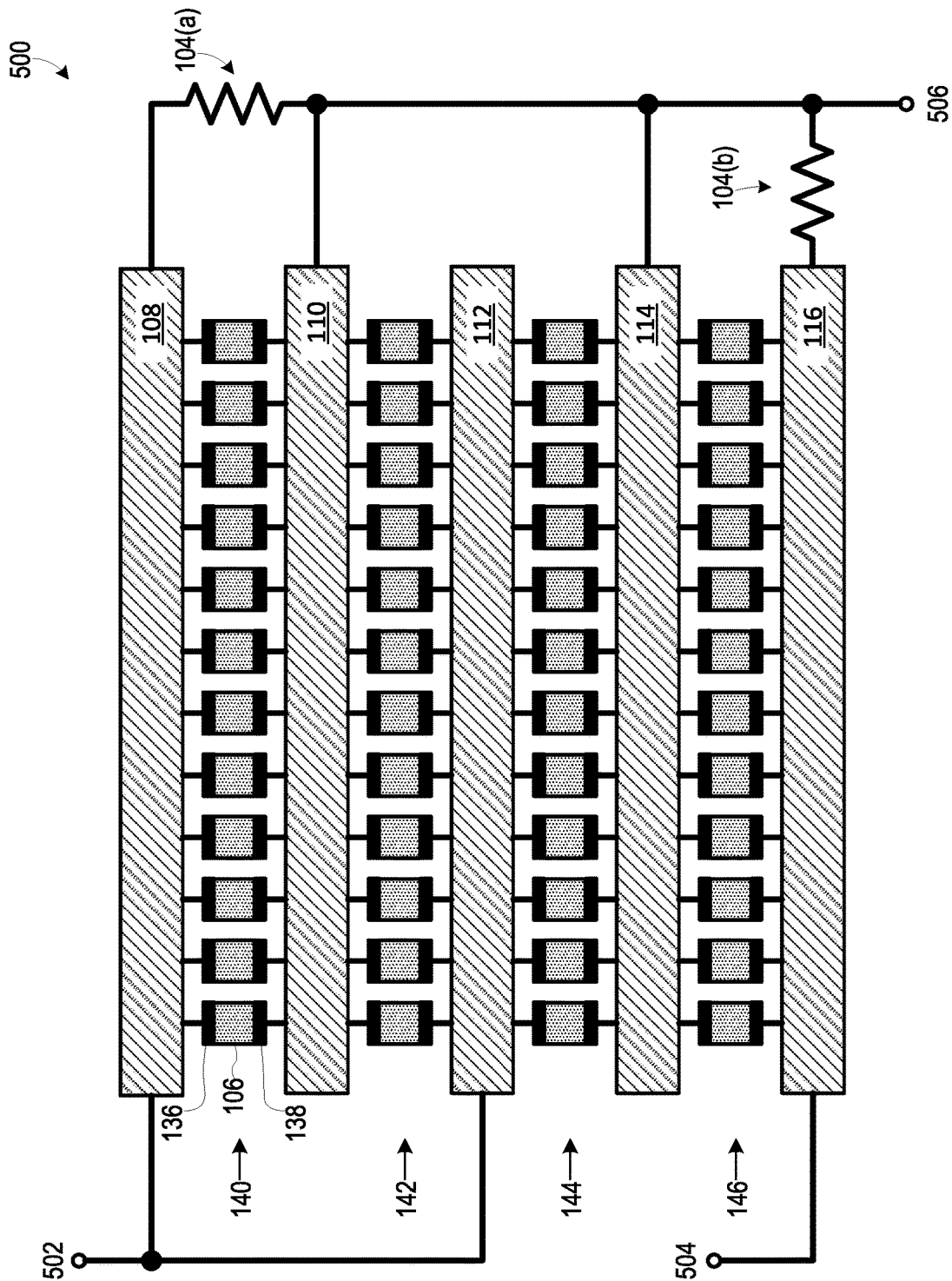
FIG. 5 is an electrical schematic diagram of another embodiment of the FIG. 1 circuit assembly.

In some embodiments, one or more of metallic bars 108-116 serve as power supply conductors for two or more power supply rails, such as to provide two or more different power supply voltages to electrical load 104. For example, FIG. 5 is an electrical schematic diagram 500 of one embodiment of circuit assembly 100 where the metallic bars serve as power supply conductors for two different supply rails. Specifically, metallic bars 108 and 112 are electrically coupled to an electrical node 502, metallic bar 116 is electrically coupled to an electrical node 504, and metallic bars 110 and 114 are electrically coupled to an electrical node 506. A first portion of electrical load 104, symbolically shown by a resistor 104($a$), is electrically coupled between electrical nodes 502 and 506. A second portion of electrical load 104, symbolically shown by resistor a 104($b$), is electrically coupled between electrical nodes 504 and 506. The first and second portions of electrical load 104, for example, require different power supply voltages and are therefore powered from power supply nodes 502 and 504, respectively. Electrical node 506 is, for example, a reference node. Capacitors 106 in row 146 are electrically coupled between metallic bars 114 and 116, and these capacitors are therefore electrically coupled between electrical nodes 504 and 506. Capacitors 106 in row 140 are electrically coupled between metallic bars 108 and 110, capacitors 106 in row 142 are electrically coupled between metallic bars 110 and 112, and capacitors 106 in row 144 are electrically coupled between metallic bars 112 and 114. Therefore, capacitors 106 in rows 140, 142, and 144 are electrically coupled between electrical nodes 502 and 506.

Figure 6:
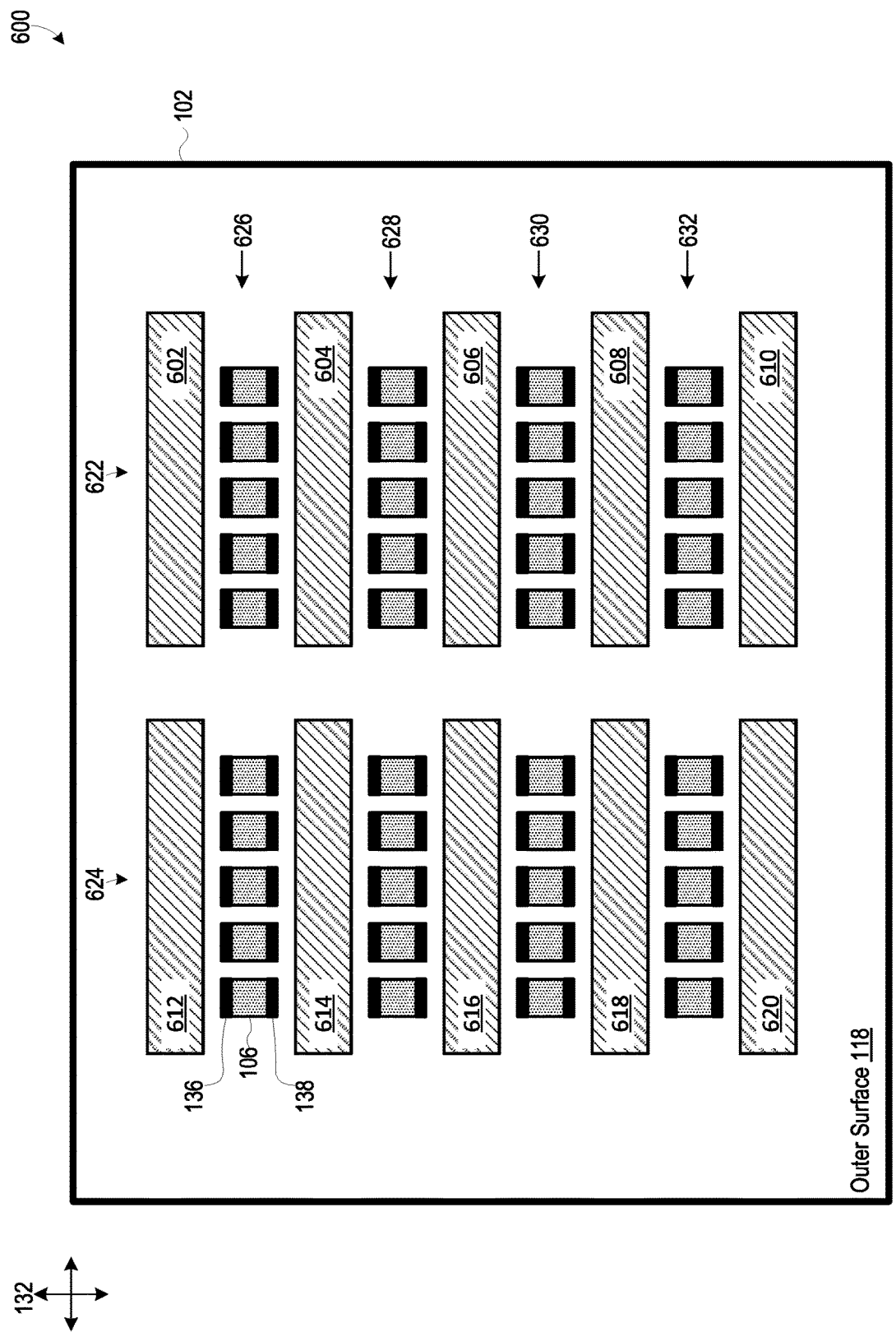
FIG. 6 is a bottom plan view of an alternate embodiment of the FIG. 1 circuit assembly.

The number, layout, and size of capacitors on outer surface 118, as well as the number, size, and layout of metallic bars on outer surface 118, may vary without departing from the scope hereof. For example, FIG. 6 is a bottom plan view of a circuit assembly 600, which is an alternate embodiment of circuit assembly 100 including eight metallic bars 602-620 in place of metallic bars 108-116. Circuit assembly 600 also includes 40 capacitors 106 in place of the 48 capacitors 106 of circuit assembly 100. Metallic bars 602-610 are disposed in a first column 622, where adjacent metallic bars of first column 622 are separated from each other in direction 132. Metallic bars 612-620 are disposed in a second column 624, where adjacent metallic bars of second column 624 are separated from each other in direction 132. First column 622 and second column 624 are separated from each other in direction 148. Capacitors 106 are disposed in rows 626-632, where each row is separated from each other row in direction 132.

Figure 7:
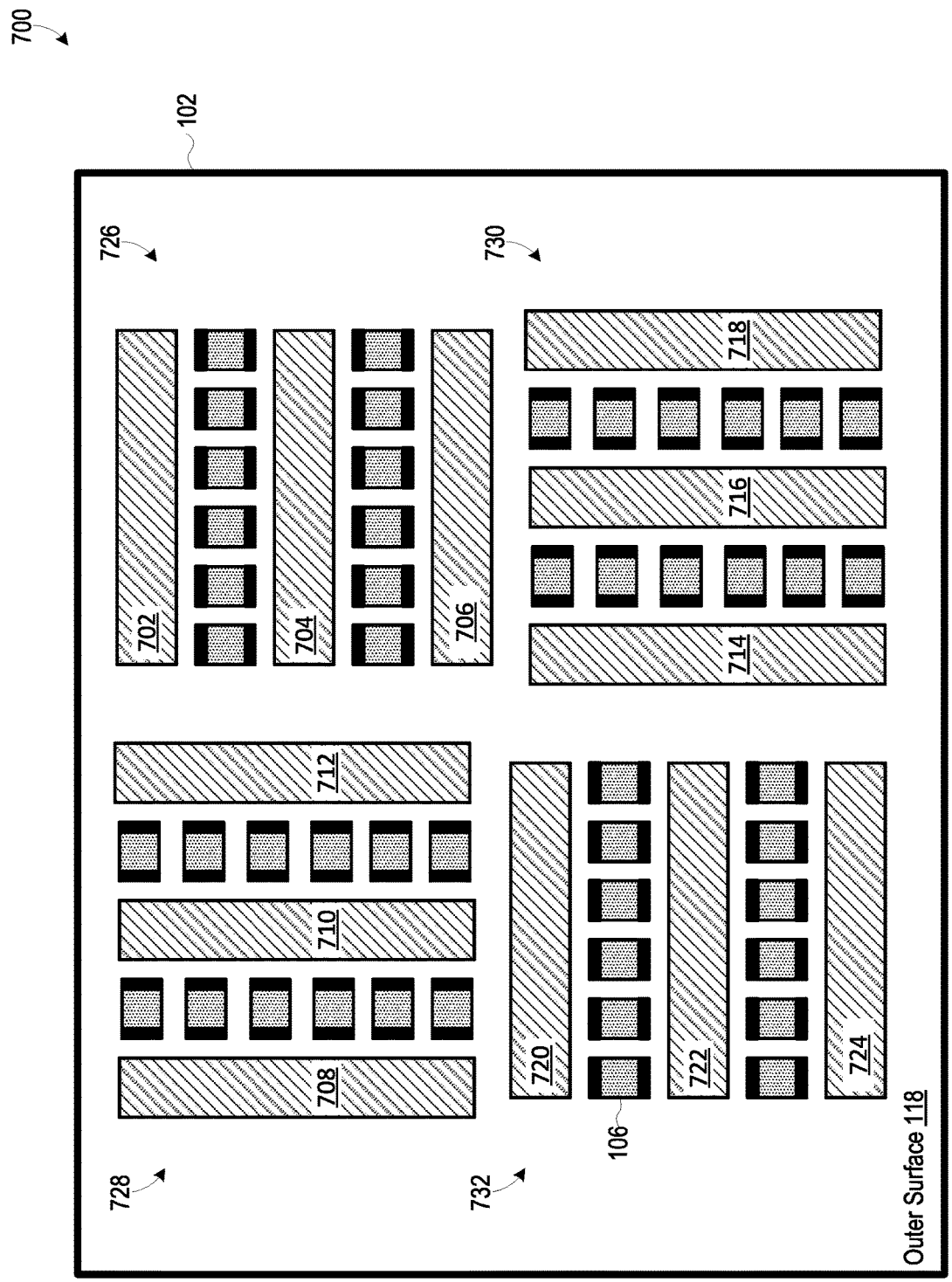
FIG. 7 is a bottom plan view of another alternate embodiment of the FIG. 1 circuit assembly.

FIG. 7 is a bottom plan view of a circuit assembly 700, which is another alternate embodiment of circuit assembly 100. Circuit assembly 700 includes 12 metallic bars 702-724 in place of metallic bars 108-116. Metallic bars 702-724 and capacitors 106 are arranged in the following four quadrants on outer surface 104: (a) a quadrant 726 including metallic bars 702-706 and 12 instances of capacitors 106, (b) a quadrant 728 including metallic bars 708-712 and 12 instances of capacitors 106, (c) a quadrant 730 including metallic bars 714-718 and 12 instances of capacitors 106, and (d) a quadrant 732 including metallic bars 720-724 and 12 instances of capacitors 106. Elongated axes of metallic bars in quadrants 726 and 732 extend in direction 148, and elongated axes of metallic bars in quadrants 728 and 730 extend in direction 132.

Figure 8:
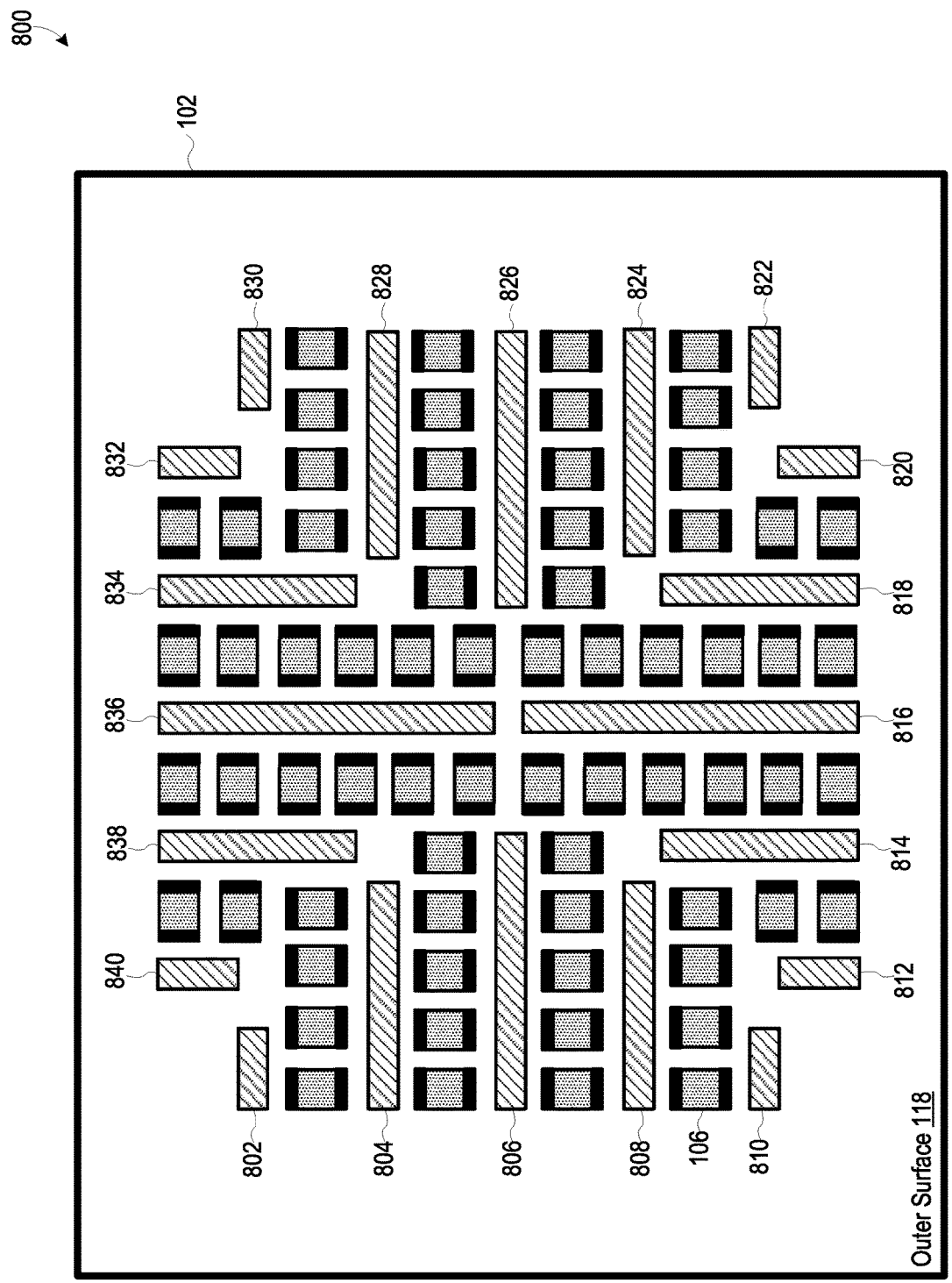
FIG. 8 is a bottom plan view of another alternate embodiment of the FIG. 1 circuit assembly.

FIG. 8 is a bottom plan view of a circuit assembly 800, which is another alternate embodiment of circuit assembly 100. Circuit assembly 800 includes 20 metallic bars 802-840 in place of metallic bars 108-116. Circuit assembly 800 also includes 68 capacitors 106 in place of the 48 capacitors 106 of circuit assembly 100. Capacitors 106 and metallic bars 802-840 are arranged in a star pattern on outer surface 118, in circuit assembly 800.

Figure 28:
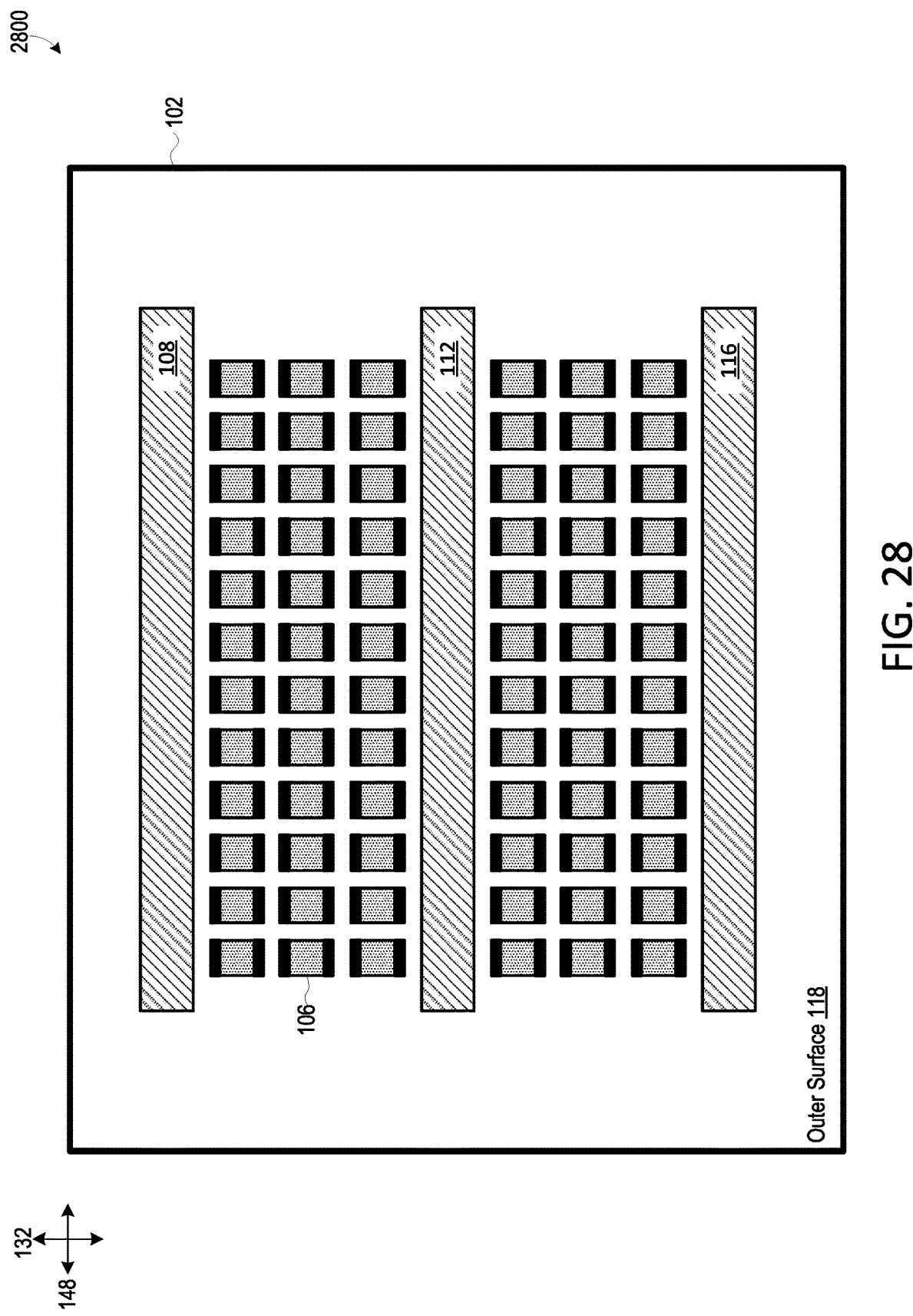
FIG. 28 is a bottom plan view of another alternate embodiment of the FIG. 1 circuit assembly.

FIG. 28 is a bottom plan view of a circuit assembly 2800, which is another alternate embodiment of circuit assembly 100. Circuit assembly 2800 includes (a) 12 additional instances of capacitor 106 in place of metallic bar 110 and (b) 12 additional instances of capacitor 106 in place of metallic bar 114. Accordingly, there are three rows of capacitors 106 between adjacent metallic bars, in circuit assembly 2800.

Figure 29:
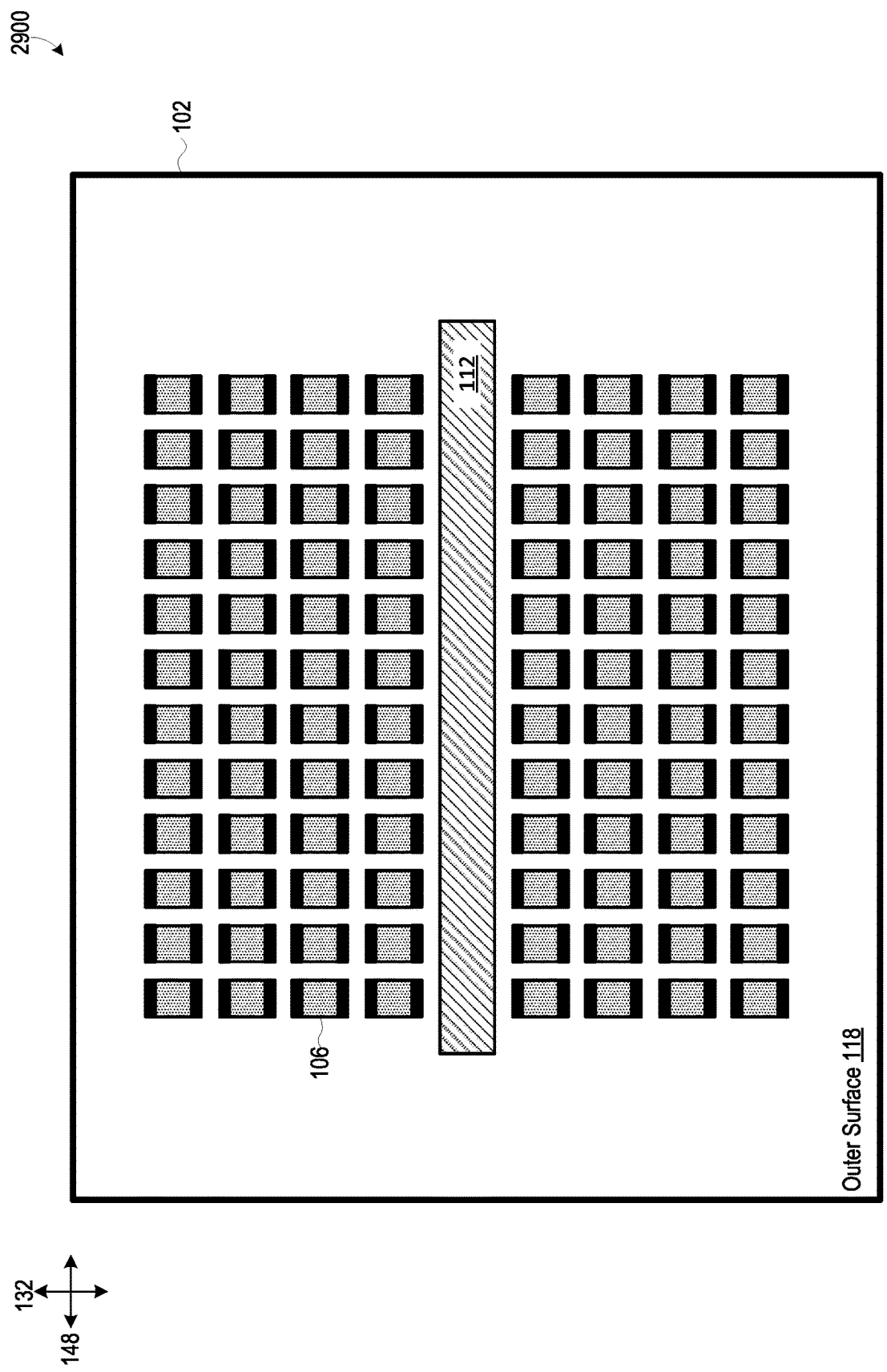
FIG. 29 is a bottom plan view of another alternate embodiment of the FIG. 1 circuit assembly.

FIG. 29 is a bottom plan view of a circuit assembly 2900, which is another alternate embodiment of circuit assembly 100. Circuit assembly 2900 includes 12 additional instances of capacitor 106 in place of each of metallic bars 108, 110, 114, and 116, such that there is only one metallic bar (112) on outer surface 118.

Referring again to FIGS. 1-3, some or all of capacitors 106 could be replaced with other components. For example, one or more of capacitors 106 could be replaced with resistors or diodes including respective first and second terminals analogous to first terminals 136 and second terminals 138. As another example, one or more capacitors 106 could be replaced with a transistor or other component including three or more terminals. Furthermore, circuit assembly 100 can, and often will, include components in addition to those illustrated in FIG. 1-3. FIGS. 9-25, discussed below, illustrate some examples of embodiments of circuit assembly 100 including additional components. It is understood, though, that circuit assembly 100 could have other configurations without departing from the scope hereof.

Figure 9:
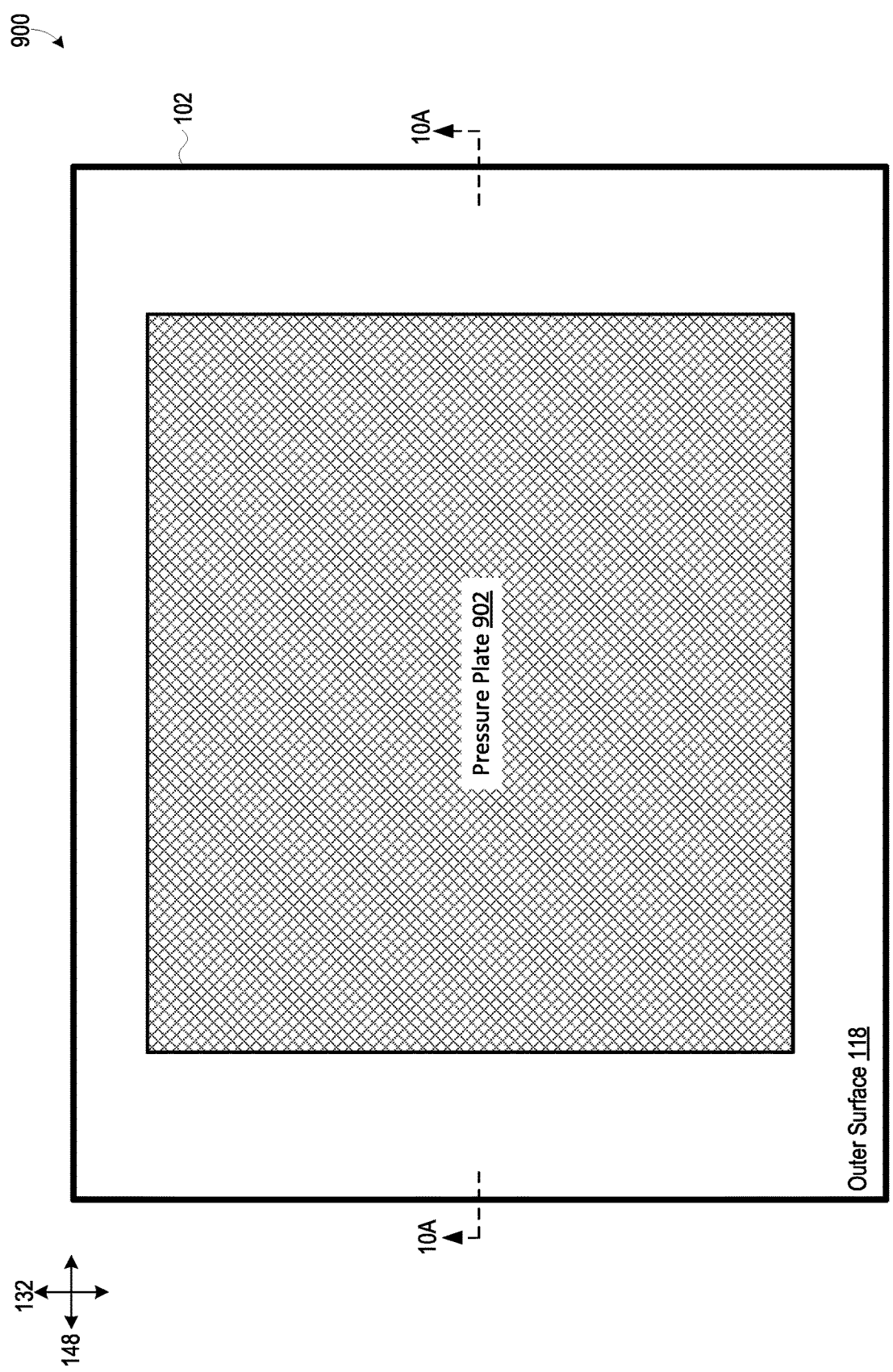
FIG. 9 is a bottom plan view of a circuit assembly including a pressure plate, according to an embodiment.
Figure 10:
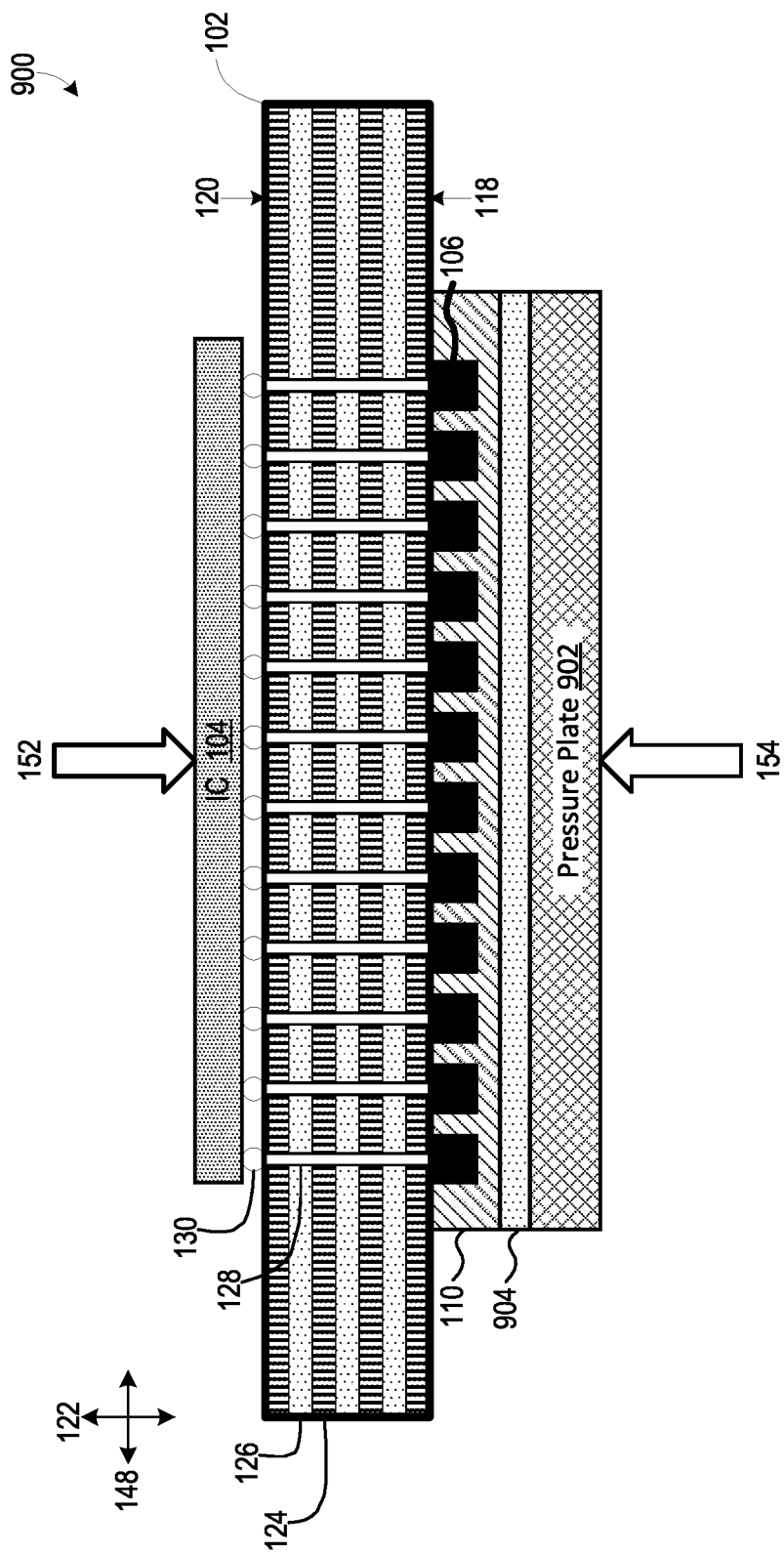
FIG. 10 is a cross-sectional view of the FIG. 9 circuit assembly.

FIG. 9 is a bottom plan view of a circuit assembly 900, and FIG. 10 is cross-sectional view of circuit assembly 900 taken along lines 10A-10A of FIG. 9. Circuit assembly 900 is an embodiment of circuit assembly 100 further including a pressure plate 902 and an isolation layer 904. Isolation layer 904 is disposed between pressure plate 902 and metallic bars 108-116 in direction 122. Pressure plate 902 is disposed over metallic bars 108-116 and capacitors 106 in direction 122, such that metallic bars 108-116, capacitors 106, and isolation layer 904 are disposed between substrate 102 and pressure plate 902 in direction 122. Pressure plate 902, for example, receives mechanical force 154, and metallic bars 108-116 advantageously transfer mechanical force 154 from pressure plate 902 to substrate 102, so that capacitors 106 are not subjected to mechanical force 154. Isolation layer 904 electrically isolates metallic bars 108-116 from pressure plate 902. Pressure plate 902 is formed, for example, of metal.

Figure 11:
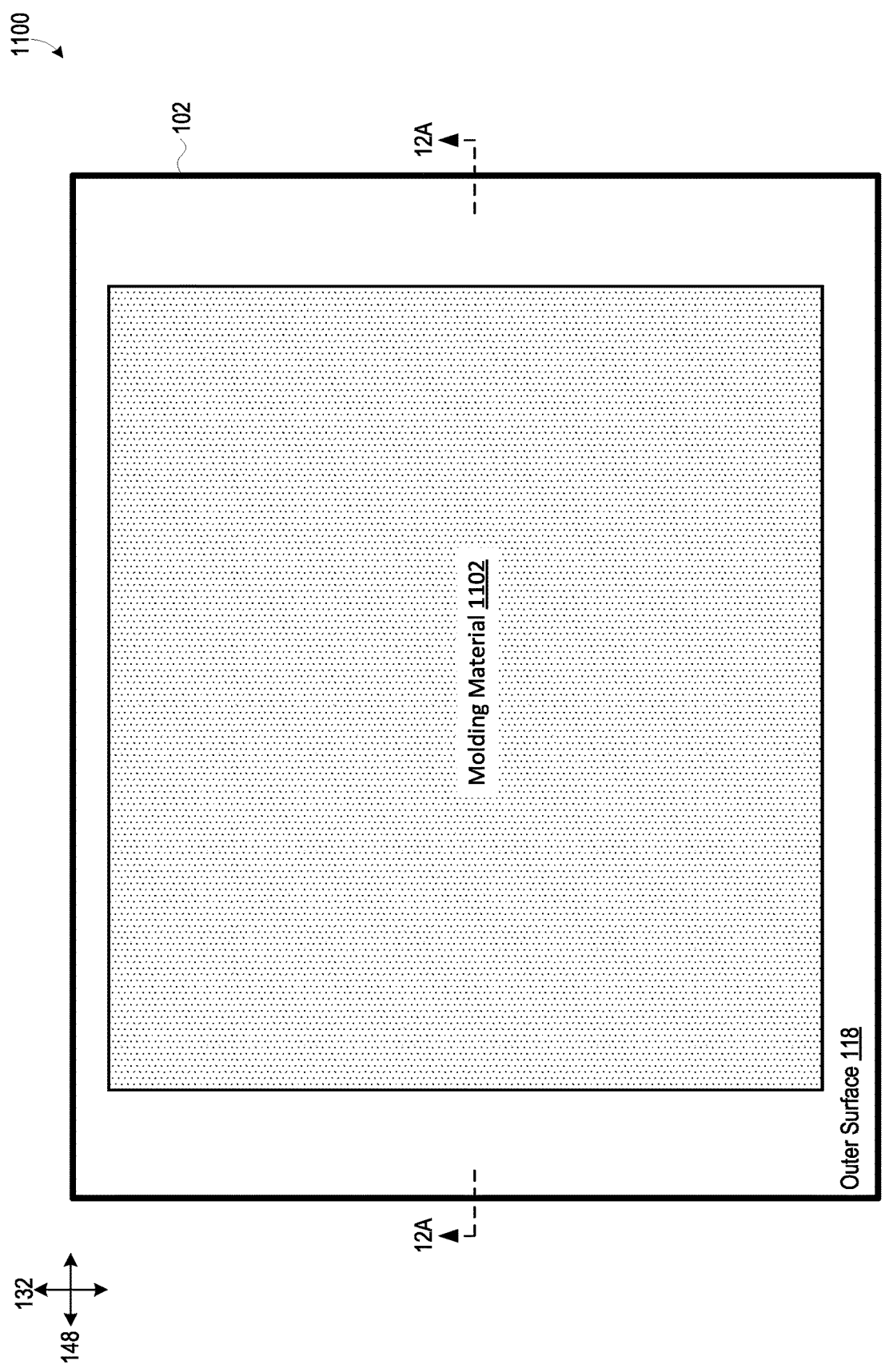
FIG. 11 is a bottom plan view of a circuit assembly including molding material, according to an embodiment.
Figure 12:
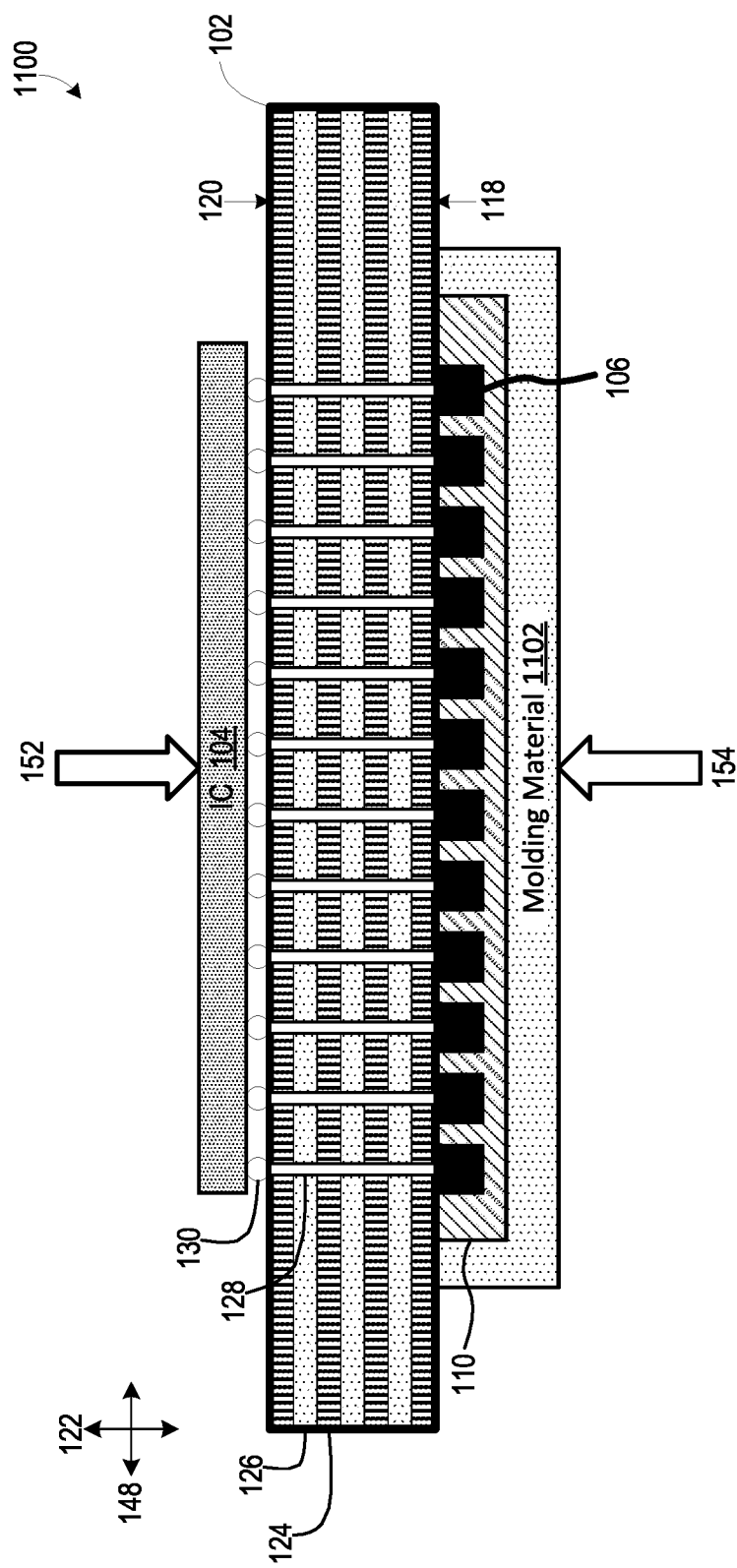
FIG. 12 is a cross-sectional view of the FIG. 11 circuit assembly.

FIG. 11 is a bottom plan view of a circuit assembly 1100, and FIG. 12 is cross-sectional view of circuit assembly 1100 taken along lines 12A-12A of FIG. 11. Circuit assembly 1100 is an embodiment of circuit assembly 100 further including molding material 1102 disposed over metallic bars 108-116 and capacitors 106. In some embodiments, molding material 1102 is a dielectric material, and in some embodiments, molding material 1102 is thermally conductive. Molding material 1102 is formed, for example, of an epoxy material. Molding material 1102, for example, receives mechanical force 154 and transfers mechanical force 154 to metallic bars 108-116 and substrate 102, so that capacitors 106 are largely sparred from receiving mechanical force 154.

Figure 13:
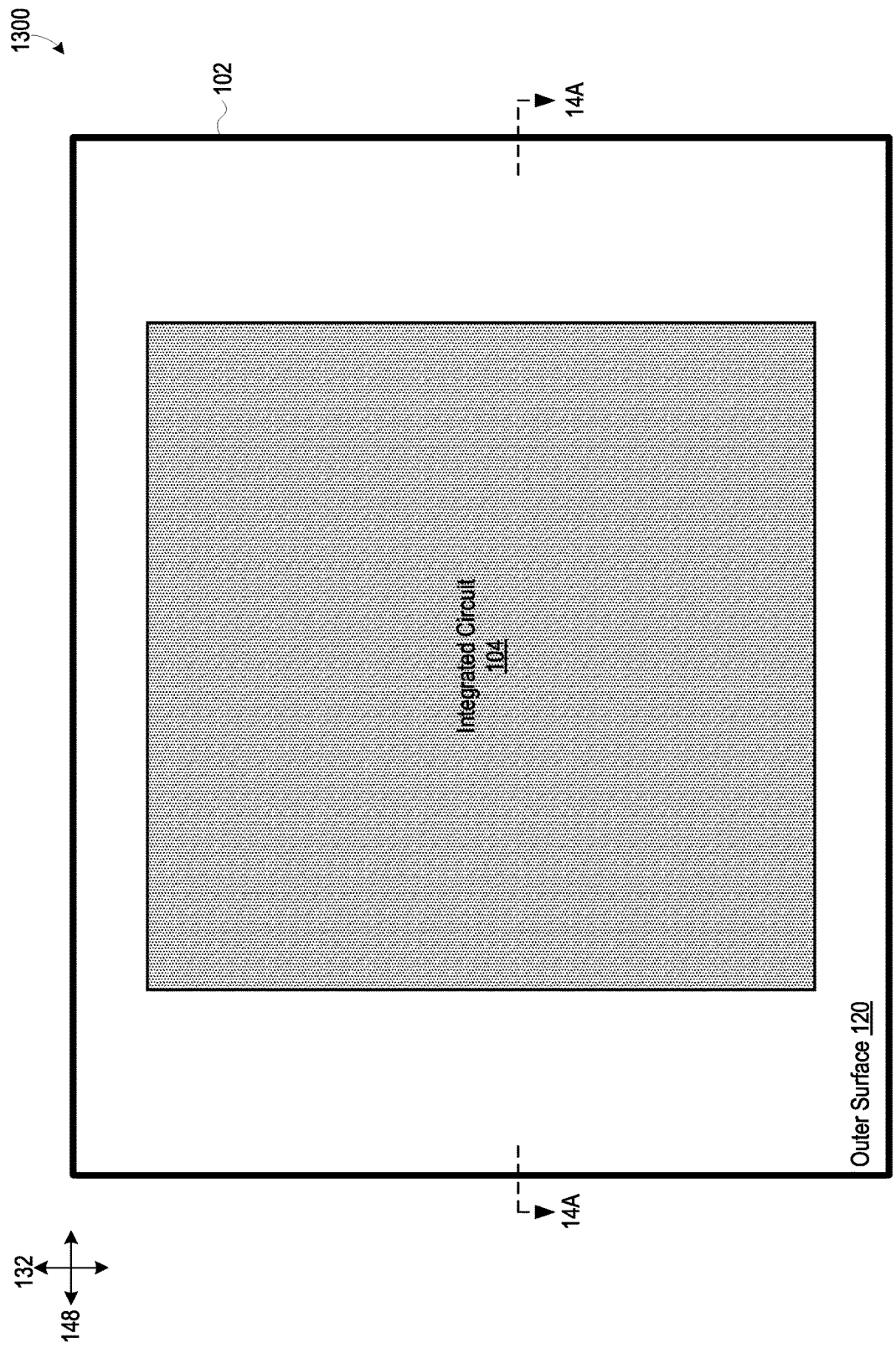
FIG. 13 is a top plan view of a circuit assembly including two substrates, according to an embodiment.
Figure 14:
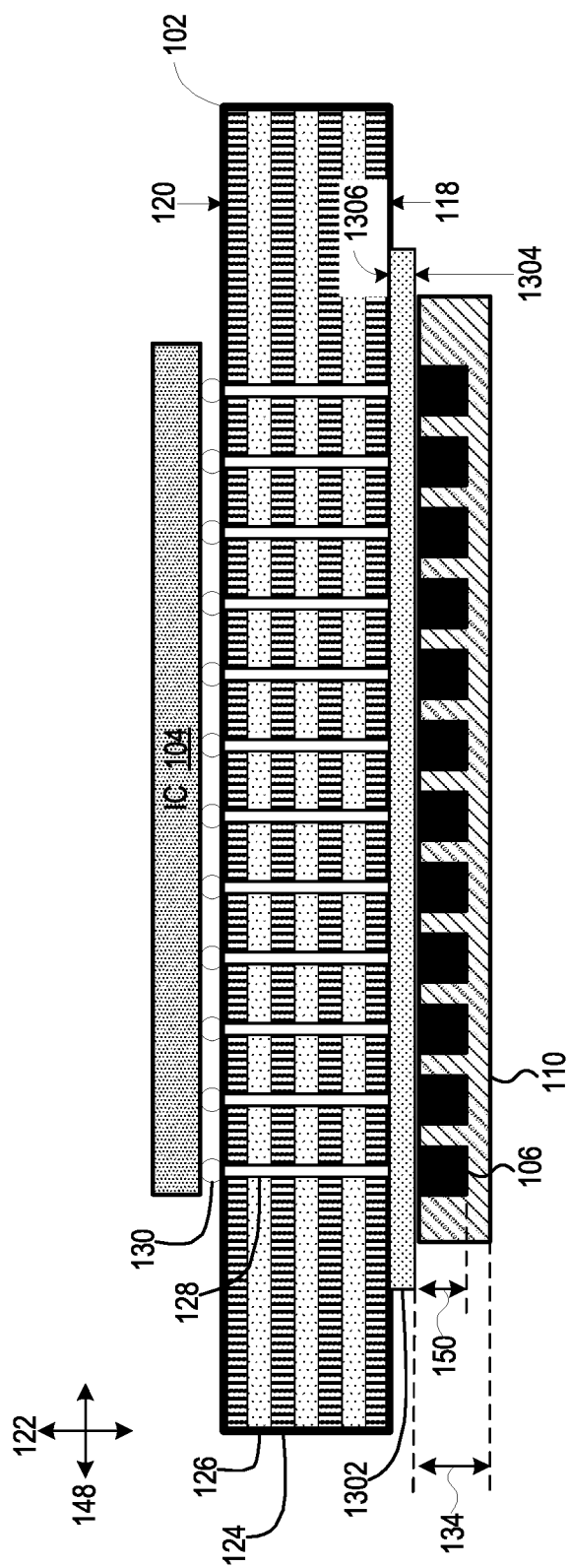
FIG. 14 is a cross-sectional view of the FIG. 13 circuit assembly.
Figure 15:
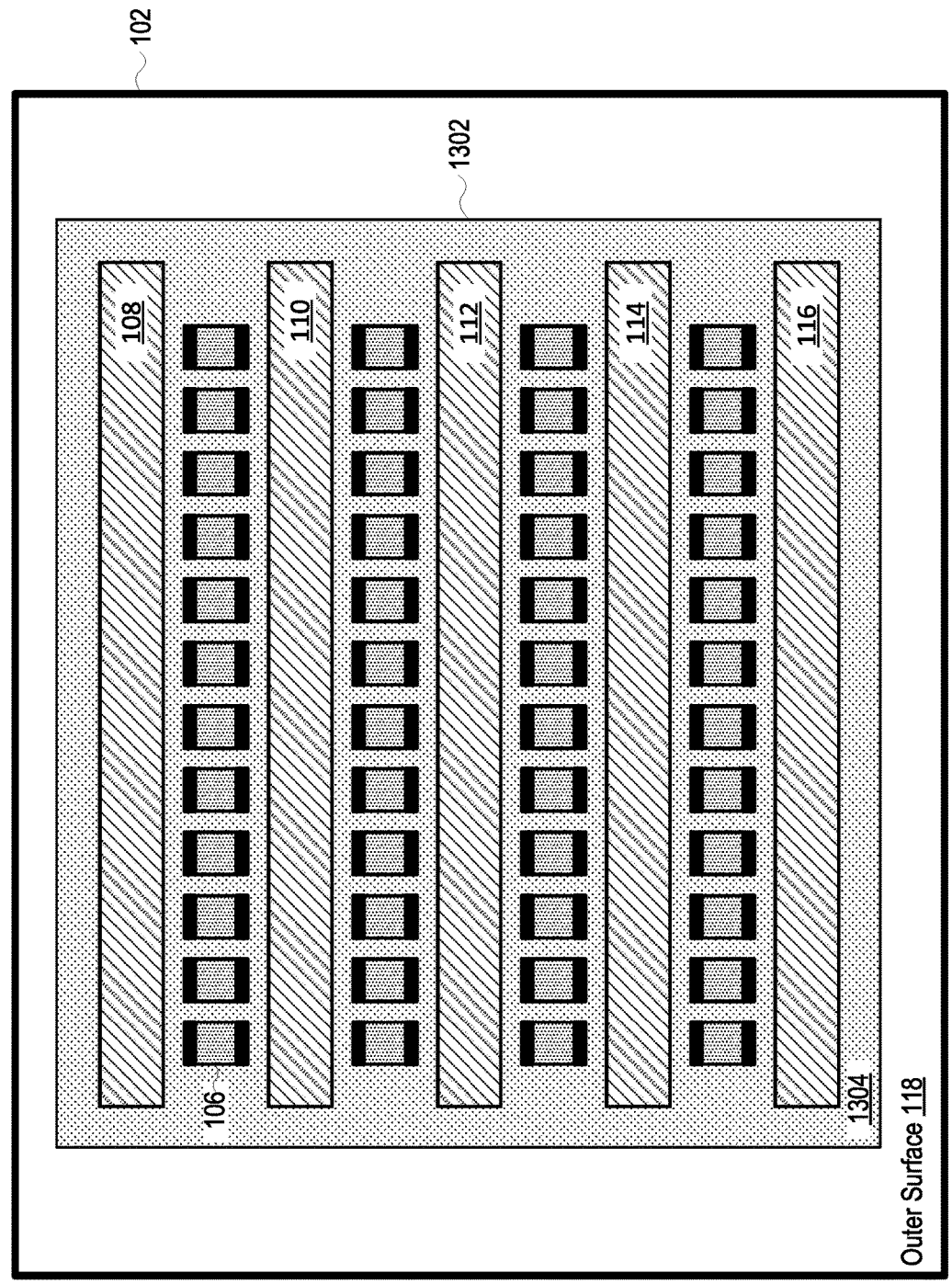
FIG. 15 is a bottom plan view of the FIG. 13 circuit assembly.

FIG. 13 is a top plan view of a circuit assembly 1300, which is an embodiment of circuit assembly 100 further including an additional substrate 1302. FIG. 14 is a cross-sectional view of circuit assembly 1300 taken along line 14A-14A of FIG. 13, and FIG. 15 is a bottom plan of circuit assembly 1300. Substrate 1302 includes outer surfaces 1304 and 1306 separated from each other in direction 122. Substrate 102 is disposed over substrate 1302 in direction 122, such that outer surface 1306 of substrate 1302 faces outer surface 118 of substrate 102. Metallic bars 108-116 and capacitors 106 are disposed on outer surface 1304 of substrate 1302. Substrate 1302 optionally includes one or more of vias (not shown) and electrical conductors (not shown) for electrically coupling metallic bars 108-116 and capacitors to substrate 102.

Figure 16:
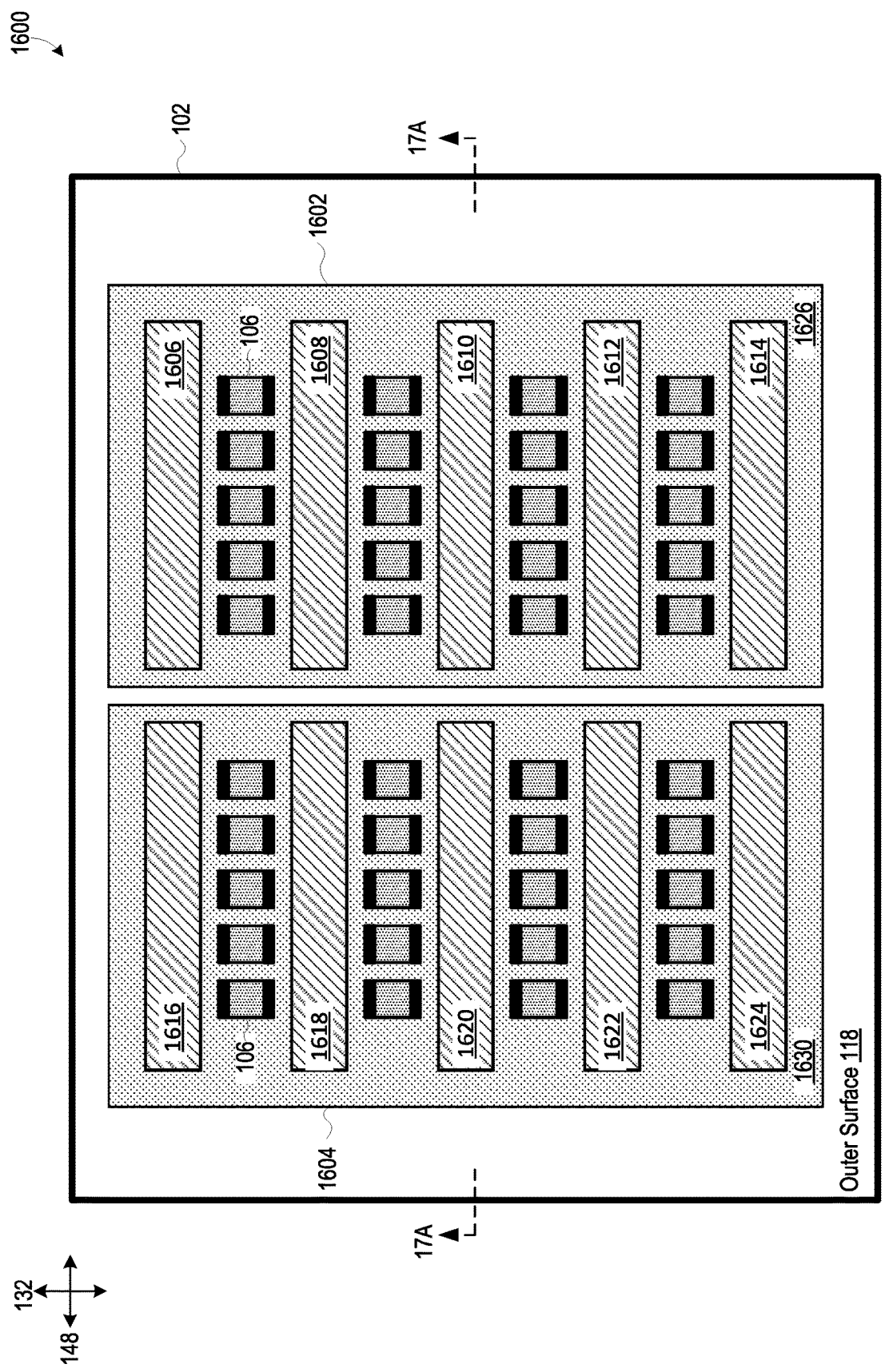
FIG. 16 is a bottom plan view of a circuit assembly including three substrates, according to an embodiment.
Figure 17:
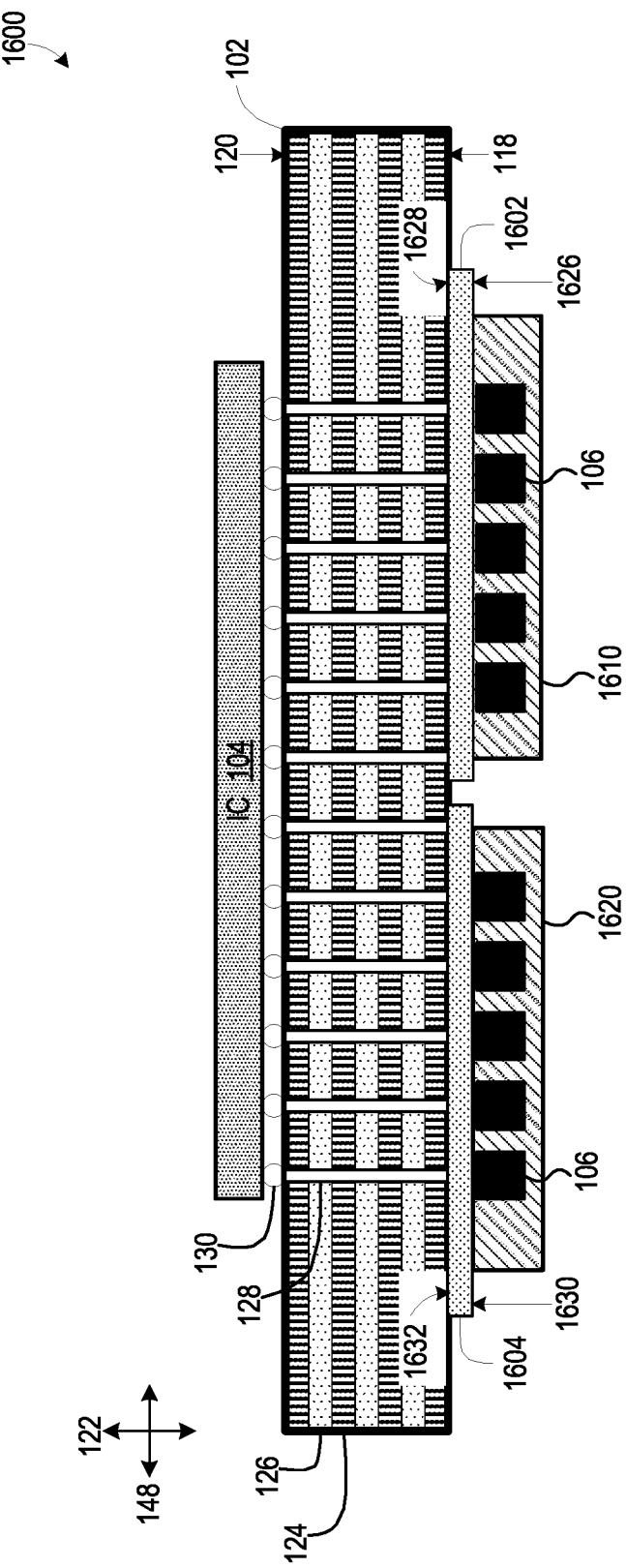
FIG. 17 is a cross-sectional view of the FIG. 16 circuit assembly.

FIG. 16 is a bottom plan view of a circuit assembly 1600, which is an embodiment of circuit assembly 100 further including two additional substrates 1602 and 1604. Additionally, circuit assembly includes metallic bars 1606-1624 in place of metallic bars 108-116, as well as 40 instances of capacitors 106 in place of 48 instances of capacitor 106. FIG. 17 is a cross-sectional view of circuit assembly 1600 taken along line 17A-17A of FIG. 16. Substrate 1602 includes outer surfaces 1626 and 1628 separated from each other in direction 122, and substrate 1604 includes outer surfaces 1630 and 1632 separated from each other in direction 122. Substrate 102 is disposed over each of substrates 1602 and 1604 in direction 122, such that (1) outer surface 1628 of substrate 1602 faces outer surface 118 of substrate 102, and (2) outer surface 1632 of substrate 1602 faces outer surface 118 of substrate 102. Metallic bars 1606-1614 and 20 instances of capacitor 106 are disposed on outer surface 1626 of substrate 1602, and metallic bars 1616-1624 and another 20 instances of capacitor 106 are disposed on outer surface 1630 of substrate 1602.

Figure 18:
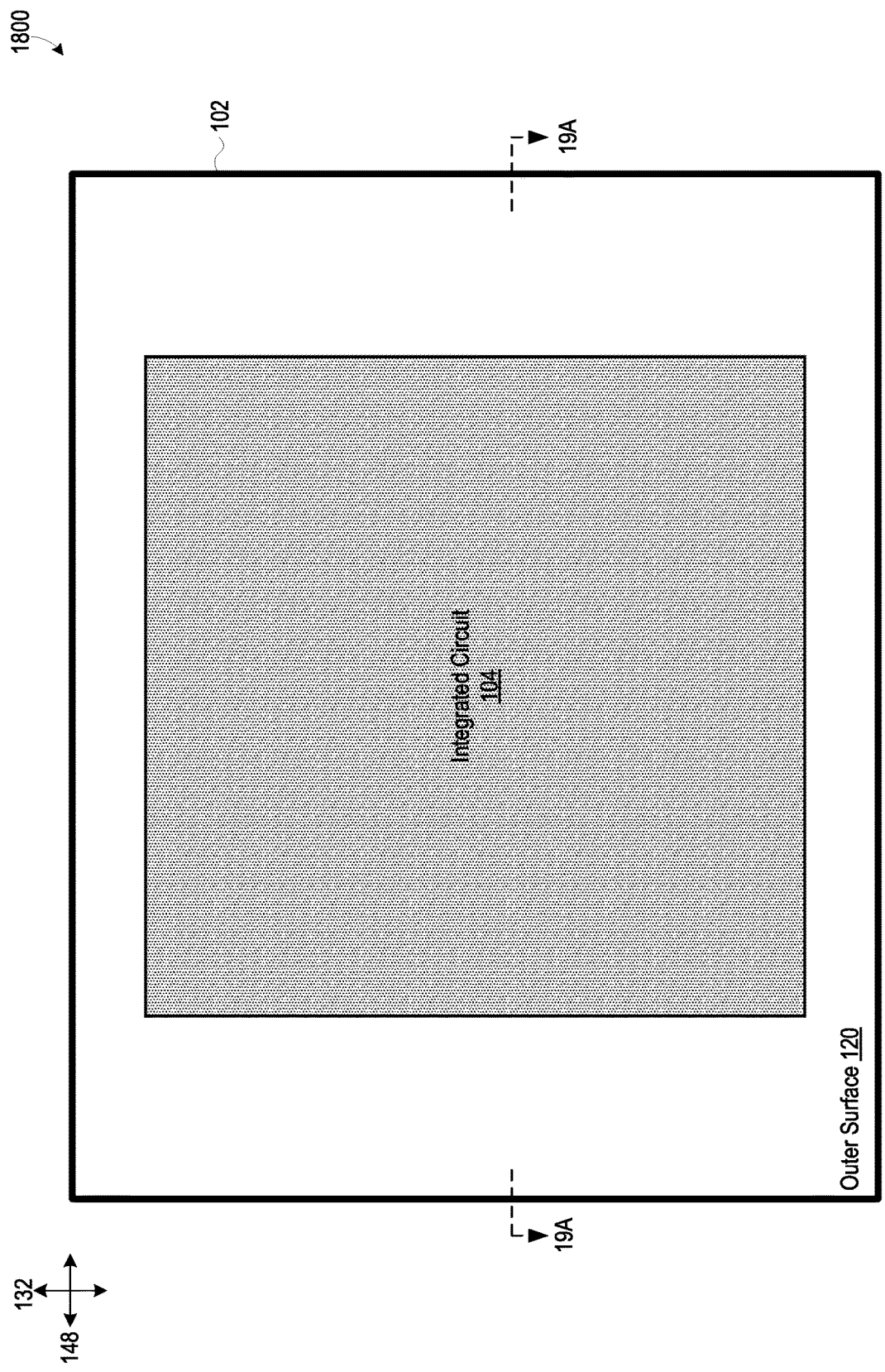
FIG. 18 is a top plan view of a circuit assembly include two layers of metallic bars, according to an embodiment.
Figure 19:
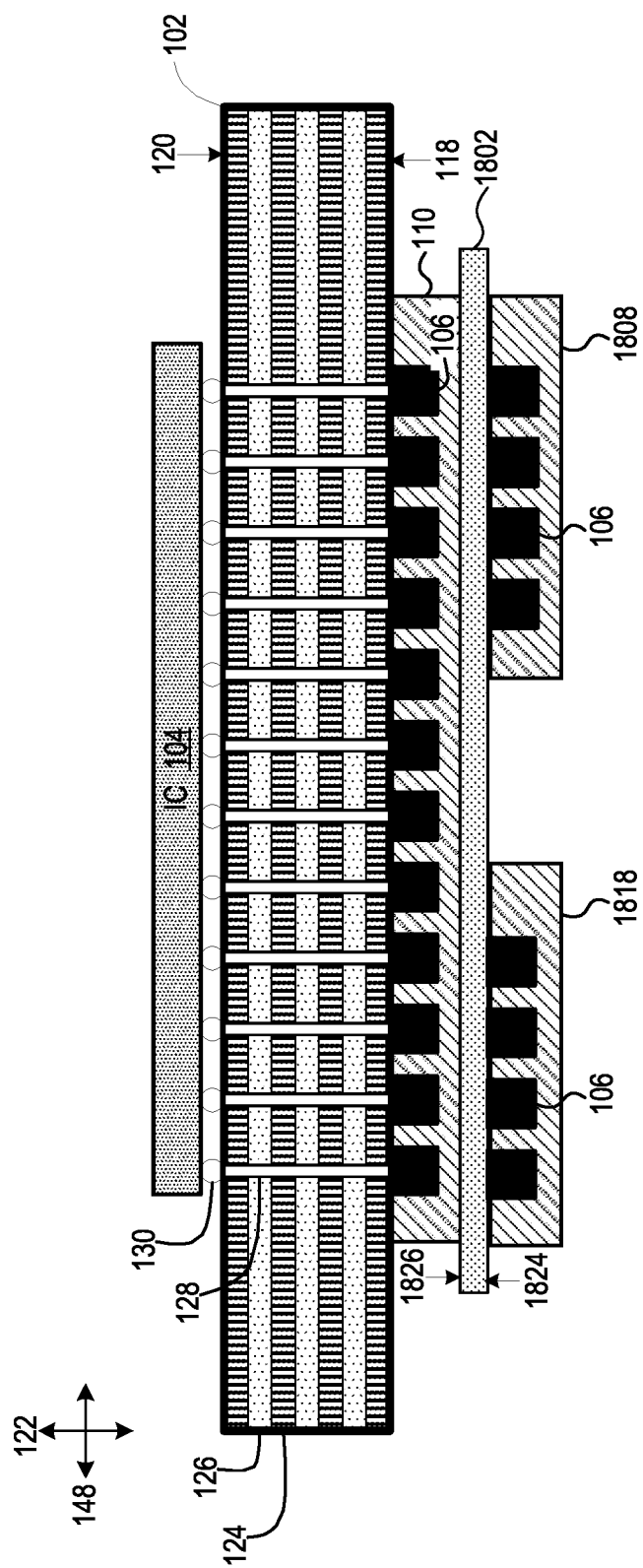
FIG. 19 is a cross-sectional view of the FIG. 18 circuit assembly.
Figure 20:
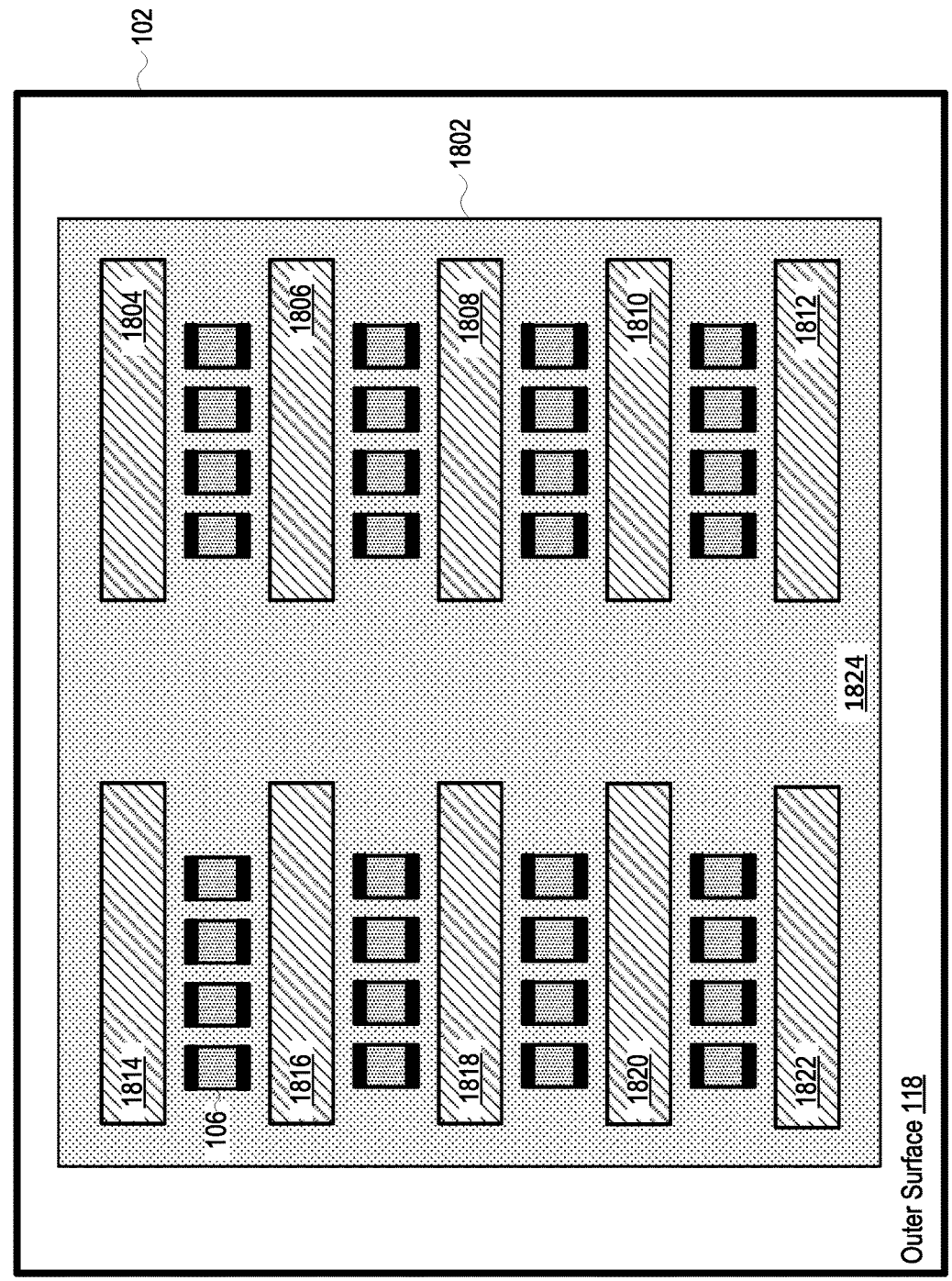
FIG. 20 is a bottom plan view of the FIG. 18 circuit assembly.

FIG. 18 is a top plan view of a circuit assembly 1800, which is an embodiment of circuit assembly 100 further including two layers of metallic bars. FIG. 19 is a cross-sectional view of circuit assembly 1800 taken along line 19A-19A of FIG. 18, and FIG. 20 is a bottom plan of circuit assembly 1800. Circuit assembly 1800 includes the following components in addition to the components of circuit assembly 100: (1) a substrate 1802, (2) metallic bars 1804-1822, and (3) 32 additional instances of capacitor 106. Substrate 1802 includes opposing outer surfaces 1824 and 1826 separated from each other in direction 122. Substrate 1802 is disposed over metallic bars 108-116 with outer surface 1826 facing outer surface 118 of substrate 102, such that metallic bars 108-116 are disposed between substrates 102 and 1802 in direction 122. Metallic bars 1804-1822 and 32 instances of capacitors 106 are disposed on outer surface 1824 of substrate 1802.

Figure 21:
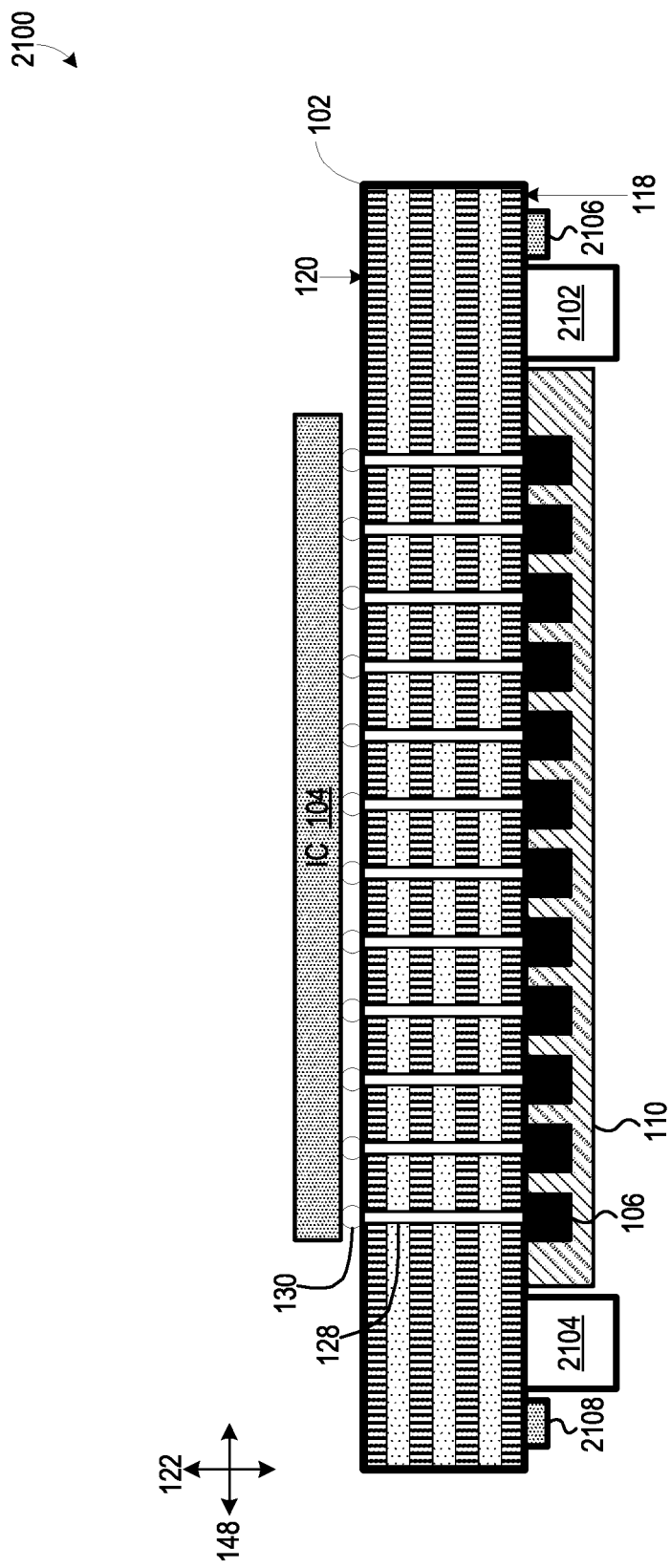
FIG. 21 is a cross-sectional view of a circuit assembly including a plurality of integrated circuits and inductors, according to an embodiment.

FIG. 21 is a cross-sectional view of a circuit assembly 2100, which is an embodiment of circuit assembly 100 including additional components on outer surface 118 of substrate 102. Specifically, circuit assembly 2100 includes inductors 2102 and 2104, along with integrated circuits 2106 and 2108, disposed on outer surface 118. One of more of inductors 2202 and 2204 are, for example, electrically coupled to one or more of metallic bars 108-116. In some embodiments, inductor 2102, inductor 2104, integrated circuit 2106, and integrated circuit 2108 form at least part of a power converter, e.g. a DC-to-DC converter, for powering electrical load 104.

Figure 30:
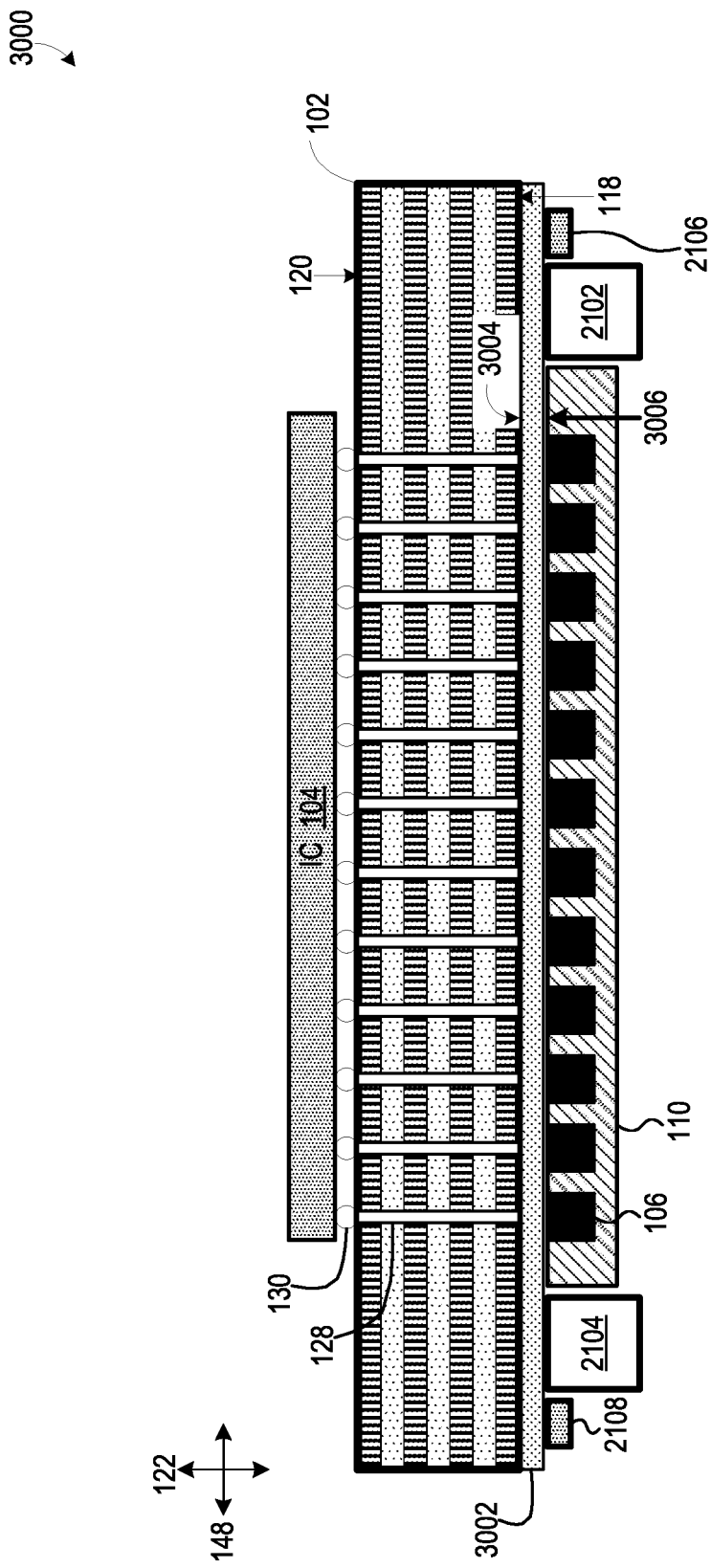
FIG. 30 is a cross-sectional view of an alternate embodiment of the FIG. 21 circuit assembly.

FIG. 30 is a cross-sectional view of a circuit assembly 3000, which is an alternate embodiment of circuit assembly 21 of FIG. 21 and further includes an additional substrate 3002 disposed on outer surface 118 of substrate 102. Substrate 3002 includes opposing outer surfaces 3004 and 3006 separated from each other in direction 122. Outer surface 3004 faces outer surface 118 of substrate 102, and capacitors 106, metallic bars 108-116, inductors 2102 and 2104, and integrated circuits 2106 and 2108 are disposed on outer surface 3006. Substrate 3002 optionally includes one or more of vias (not shown) and electrical conductors (not shown) for electrically coupling components thereon. In some embodiments, substrate 3002 and the components mounted thereon form a power converter module mounted on substrate outer surface 118. The power converter module is optionally manufactured separately from the remainder of circuit assembly 2100. In some other embodiments, one or more of inductor 2102, inductor 2104, integrated circuit 2106, and integrated circuit 2108 are located on substrate 102, instead of on substrate 3002, such that components on each of substrates 102 and 3002 collectively form a power converter.

Figure 22:
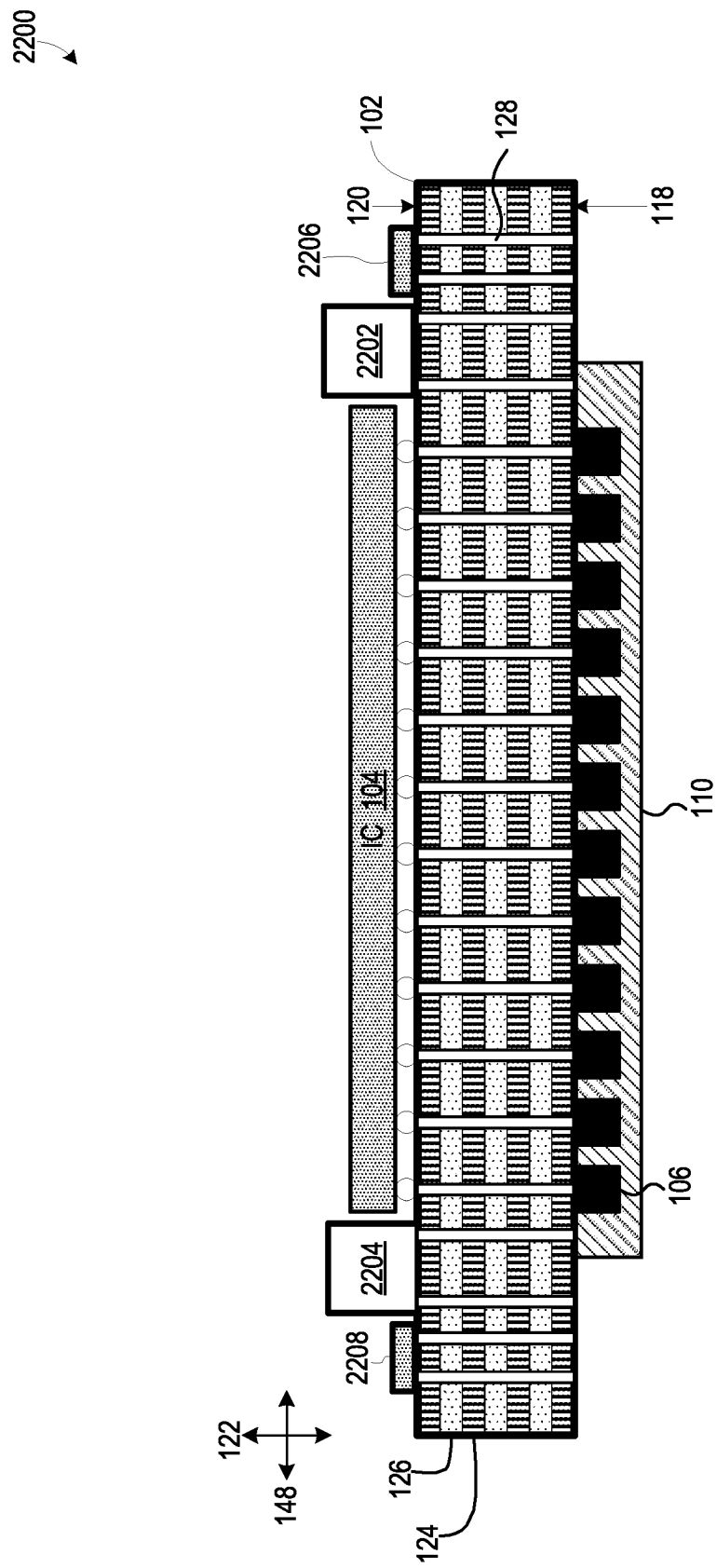
FIG. 22 is a cross-sectional view of another circuit assembly including a plurality of integrated circuits and inductors, according to an embodiment.

FIG. 22 is a cross-sectional view of a circuit assembly 2200, which is an embodiment of circuit assembly 100 including additional components on outer surface 120 of substrate 102. Specifically, circuit assembly includes inductors 2202 and 2204, along with integrated circuits 2206 and 2208, disposed on outer surface 120. One of more of inductors 2202 and 2204 are, for example, electrically coupled to one or more of metallic bars 108-116. In some embodiments, inductor 2202, inductor 2204, integrated circuit 2206, and integrated circuit 2208 form at least part of a power converter, e.g. a DC-to-DC converter, for powering electrical load 104.

Figure 23:
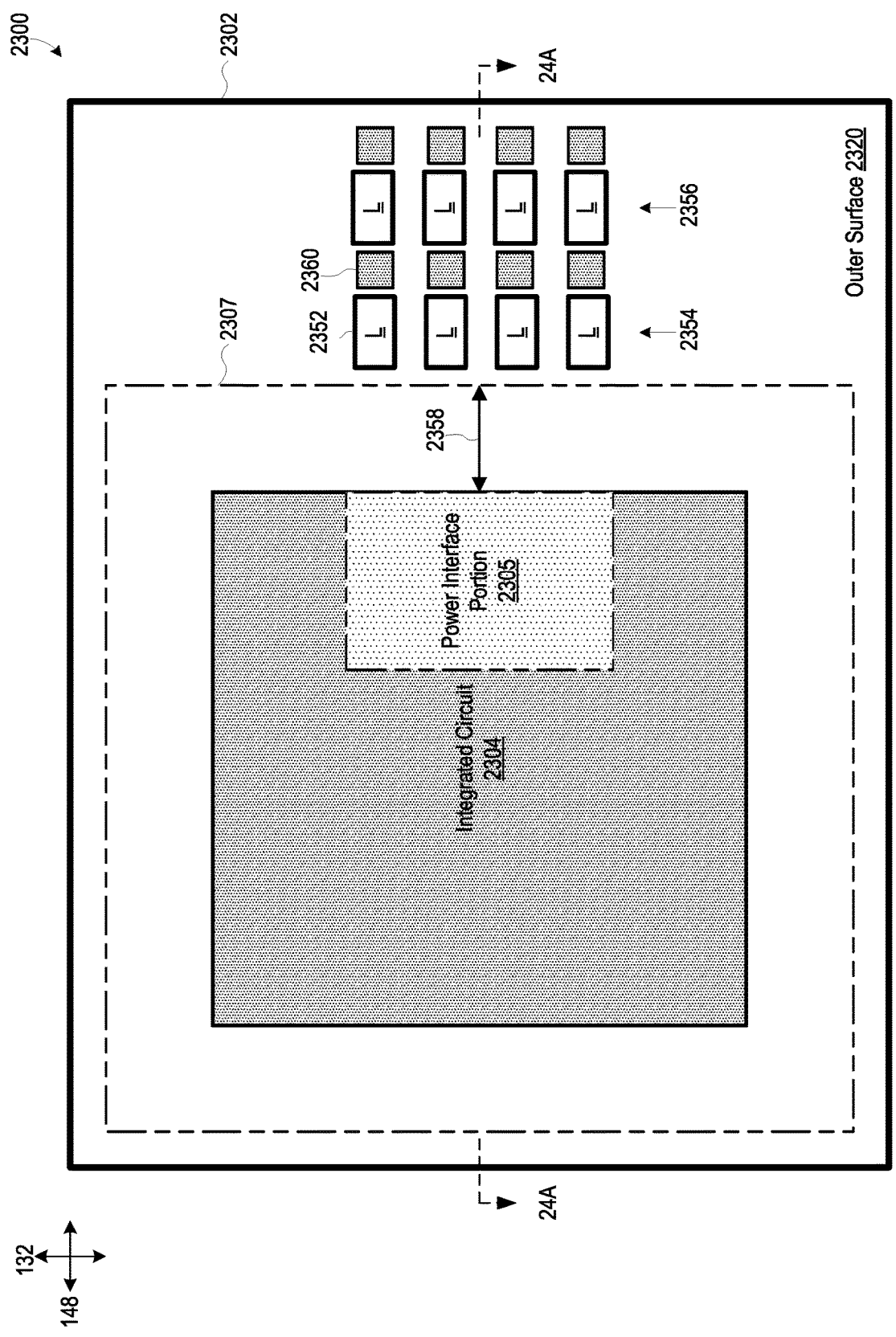
FIG. 23 is a top plan view of a circuit assembly including a plurality of rows of inductors and integrated circuits, according to an embodiment.
Figure 24:
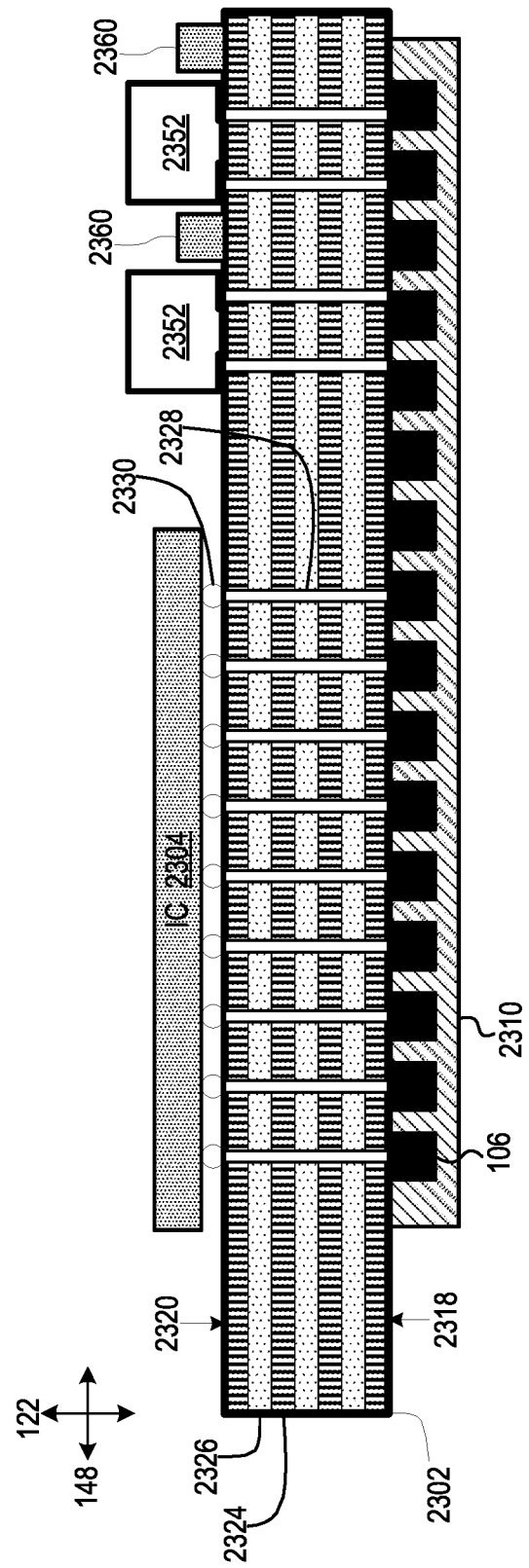
FIG. 24 is a cross-sectional view of the FIG. 23 circuit assembly.
Figure 25:
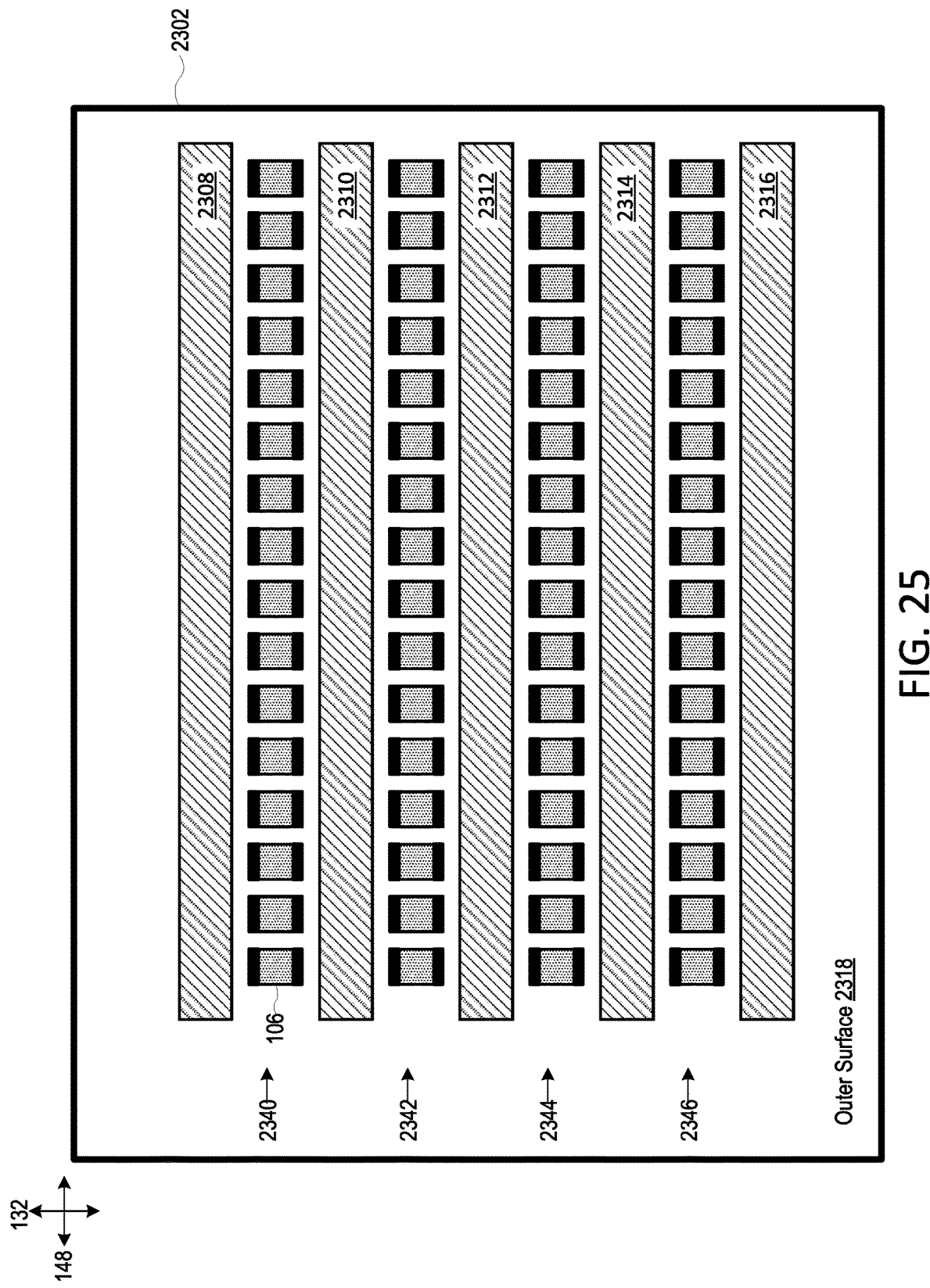
FIG. 25 is a bottom plan view of the FIG. 23 circuit assembly.

FIG. 23 is a top plan view of a circuit assembly 2300, which is similar to circuit assembly 100 of FIGS. 1-3, but further includes a plurality of rows of inductors and integrated circuits on a substrate outer surface. FIG. 24 is a cross-sectional view of circuit assembly 2300 taken along line 24A-24A of FIG. 23, and FIG. 25 is a bottom plan view of circuit assembly 2300. Circuit assembly 2300 includes a substrate 2302, an electrical load 2304, a plurality of capacitor 106 instances, and metallic bars 2308-2316.

Substrate 2302 is similar to substrate 102 of FIGS. 1-3 but has different dimensions. Substrate 2302 includes an outer surface 2318 and an opposing outer surface 2320 separated from each other in direction 122. Substrate 2302 is a PCB including a plurality of metallic layers 2324 separated from each other in direction 122 by a plurality of insulating layers 2326 (FIG. 24). Only one metallic layer 2324 and one insulating layer 2326 are labeled for illustrative clarity. Substrate 2302 further includes vias 2328 which electrically connect two or more different metallic layers 2324 in direction 122 (FIG. 24). Only one via 2328 is labeled for illustrative clarity.

Electrical load 2304 is disposed on outer surface 2320 of substrate 2302. Electrical load 2304 is an integrated circuit connected to substrate 2302 via solder balls 2330 (only one of which is labeled). Electrical load 2304 includes a power interface portion 2305, approximately denoted by dashed lines in FIG. 23, which is configured to receive electrical power from a power source. For example, power interface portion 2305 may include a plurality of terminals for connecting to one or more power supply nodes and a reference node. One or more heatsinks (not shown) are optionally affixed to electrical load 2304. A region of outer surface 2320, referred to as keep-out area 2307, is reserved, for example, for the heatsink.

Metallic bars 2308-2316 are disposed on outer surface 2318, and in some embodiments, electrical load 2304 is disposed over at least a portion of one or more of metallic bars 2308-2316 in direction 122. Metallic bars 2308-2316 are separated from each other in a direction 132 (FIG. 25). Capacitors 106 are also disposed on outer surface 2318 (FIGS. 24 and 25). Only one instance of capacitor 106 is labeled in each of FIGS. 23-25 for illustrative clarity. Capacitors 106 are disposed in rows 2340-2346, where each row is separated from each other row in direction 132, and where each row is bounded in direction 132 by a respective pair of metallic bars 2308-2316. Capacitors 106 within a given row 2340-2346 are separated from each other in a direction 148.

Circuit assembly 2300 further includes a plurality of inductors 2352 disposed in two columns 2354 and 2356 on outer surface 2320. Only one instance of inductor 2352 is labeled in FIG. 23 for illustrative clarity. Inductors 2352 in each column 2354, 2356 are separated from each other in direction 132, and columns 2354 and 2356 are separated from each other in direction 148. A column of integrated circuits 2360 bounds each column 2354 and 2356 of inductors 2352 in direction 148. Only one integrated circuit 2360 is labeled in FIG. 23 for illustrative clarity, and each integrated circuit 2360 need not have the same configuration. In some embodiments, inductors 2352 and integrated circuits 2360 form part of a power converter, e.g. a DC-to-DC converter, for powering electrical load 2304. Accordingly, in some embodiments, inductors 2352 and/or integrated circuits 2360 are electrically coupled to at least one of metallic bars 2308-2316, which are in turn electrically coupled to power interface portion 2305 of integrated circuit 2304. The number of inductors 2352 in each column 2354 and 2356, the number of columns of inductors 2352, and the number of integrated circuits 2360, may vary without departing from the scope hereof.

It should be noted that inductors 2352 are separated from electrical load 2304 by a significant separation distance 2358 in direction 148, due to presence of keep-out area 2307. However, the relatively low impedance of metallic bars 2308-2316 helps mitigate parasitic impedance associated with separation distance 2358, thereby helping maintain a low impedance power supply path to integrated circuit 2304 despite significant separation distance 2358.

Figure 26:
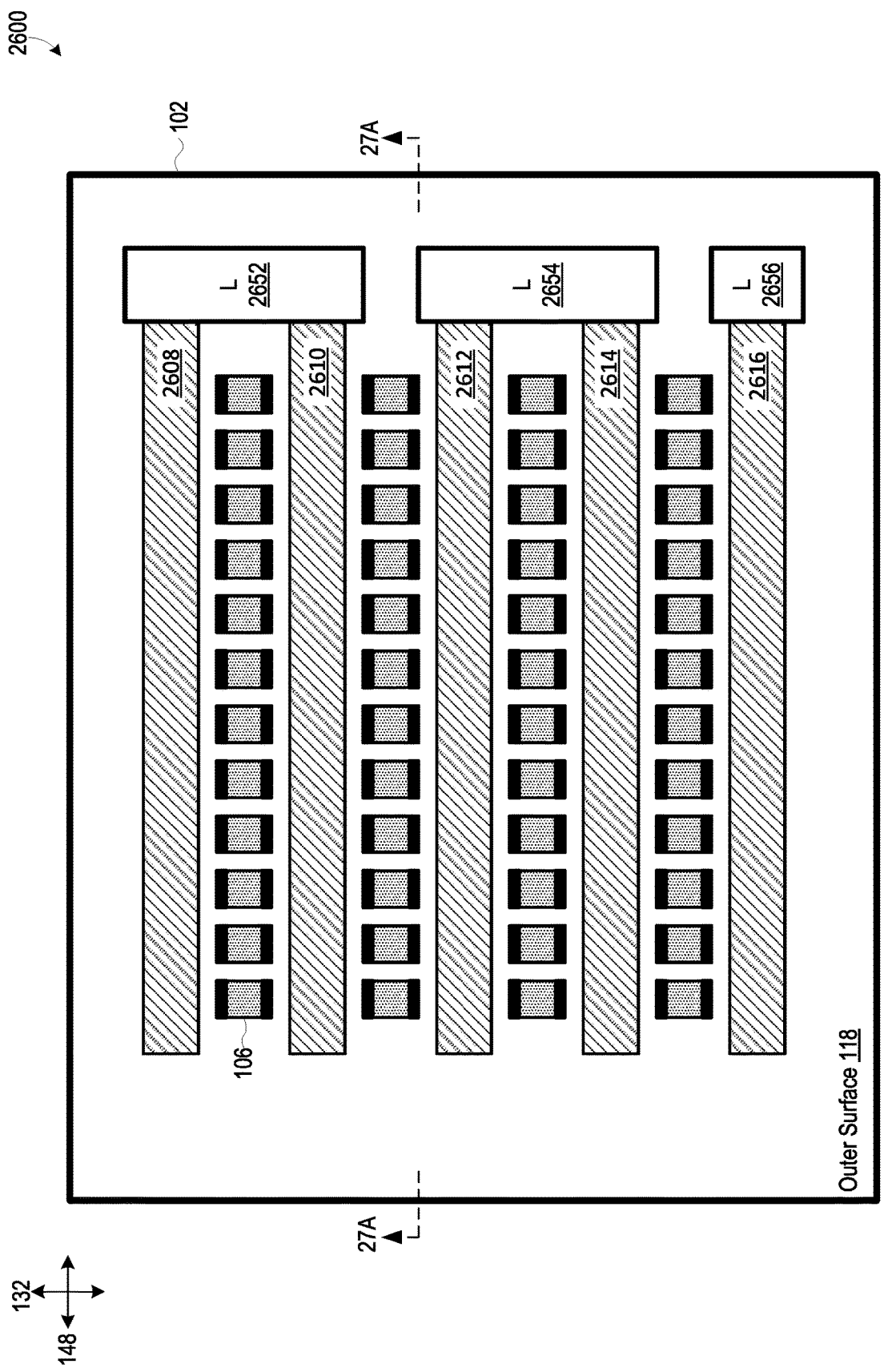
FIG. 26 is a bottom plan view of a circuit assembly including metallic bars that are extensions of inductor windings, according to an embodiment.
Figure 27:
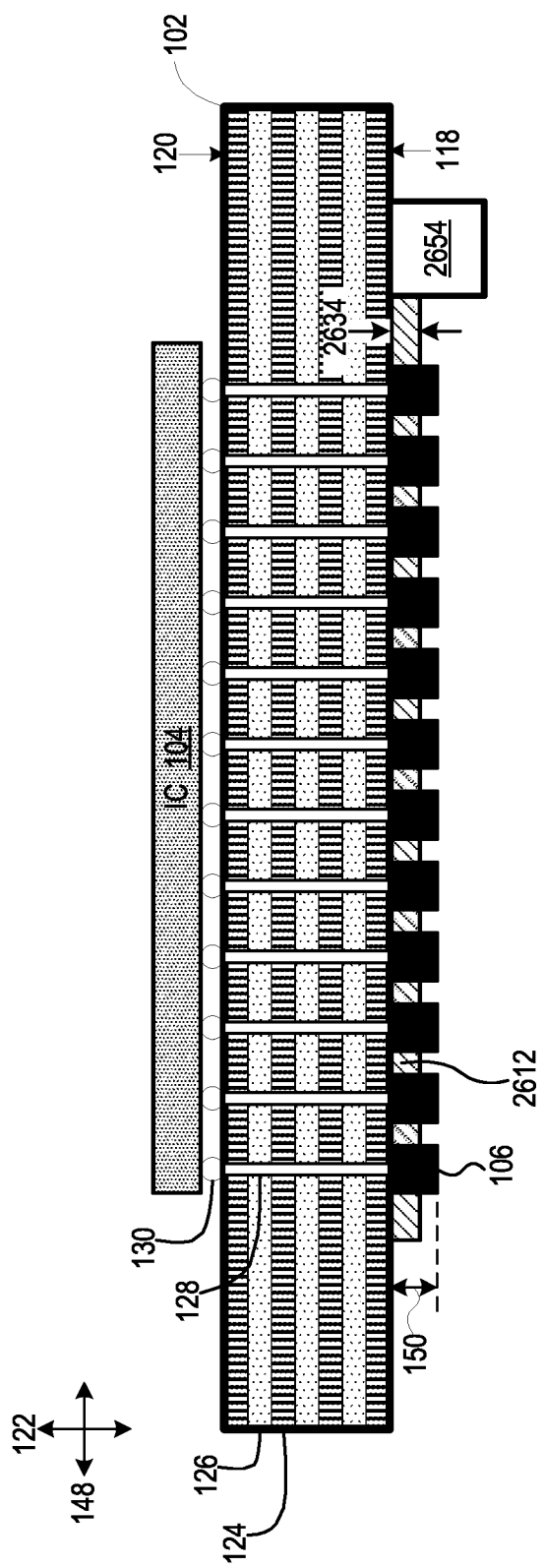
FIG. 27 is a cross-sectional view of the FIG. 26 circuit assembly.

Referring again to FIGS. 2 and 3, in circuit assembly 100, metallic bars 108-116 are discrete elements, which advantageously enables them to have a relatively large bar thickness 134, e.g. that is greater than capacitor thickness 150. However, metallic bars 108-116 could be replaced with metallic bars that are part of another element, such as an inductor, without departing from the scope hereof. For example, FIG. 26 is a bottom plan view of a circuit assembly 2600, which is an alternate embodiment of circuit assembly 100 where metallic bars 108-116 are replaced with metallic bars 2608-2616 that are extensions of inductor windings. FIG. 27 is a cross-sectional view of circuit assembly 2600 taken along line 27A-27A for FIG. 26. Circuit assembly 2600 includes a coupled inductor 2652, a coupled inductor 2654, and a discrete inductor 2656 disposed on substrate outer surface 118. Winding extensions of coupled inductor 2652 form metallic bars 2608 and 2610, and winding extensions of coupled inductor 2654 form metallic bars 2612 and 2614. A winding extension of discrete inductor 2656 forms metallic bar 2616. Metallic bars 2608-2616 are separated from each other in direction 132, and adjacent metal bars are separated in direction 132 by row of capacitors 106.

Metallic bars 2608-2616 have a bar thickness 2634 in direction 122 (FIG. 27), and bar thickness 2634 need not be uniform across metallic bar instances. As illustrated in FIG. 27, bar thickness 2634 is smaller than capacitor thickness 150, due to inductor winding thickness limitations. Consequently, metallic bars 2608-2616 will not protect capacitors 106 from mechanical force applied in direction 122 toward substrate outer surface 118. Metallic bars 2608-2616 are, for example, electrically coupled to electrical load 104 (not shown in FIG. 26), and electrical load 104 is at least partially disposed over one or more of metallic bars 2608-2616 in direction 122.

Combinations of Features

Features described above may be combined in various ways without departing from the scope hereof. The following examples illustrate some possible combinations.

(A1) A circuit assembly may include (1) a first substrate including a first outer surface, (2) a first component disposed on the first outer surface, and (3) a first metallic bar disposed on the first outer surface, the first metallic bar being thicker than the first component.

(A2) In the circuit assembly denoted as (A1), the first component may have a first component thickness in a first direction orthogonal to the first outer surface, the first metallic bar may have a first bar thickness in the first direction, and the first bar thickness may be greater than the first component thickness.

(A3) The circuit assembly denoted as (A2) may further include a second metallic bar disposed on the first outer surface, the second metallic bar being separated from the first metallic bar in a second direction orthogonal to the first direction, wherein the first component is disposed between the first and second metallic bars, in the second direction.

(A4) In the circuit assembly denoted as (A3), the first component may include a first terminal and a second terminal, the first terminal may be electrically coupled to the first metallic bar, and the second terminal may be electrically coupled to the second metallic bar.

(A5) In any one of the circuit assemblies denoted as (A3) and (A4), each of the first and second metallic bars may be an extension of a respective winding of an inductor.

(A6) Any one of the circuit assemblies denoted as (A3) through (A5) may further include a pressure plate, and each of the first metallic bar, the second metallic bar, and the first component may be disposed between the first substrate and the pressure plate in the first direction. The pressure plate is optionally formed of metal, and the circuit assemblies optionally further includes an isolation layer disposed, in the first direction, between (1) the pressure plate and (2) the first metallic bar, the second metallic bar, and the first component.

(A7) Any one of the circuit assemblies denoted as (A3) through (A5) may further include molding material disposed over the first metallic bar, the second metallic bar, and the first component.

(A8) Any one of the circuit assemblies denoted as (A3) through (A7) may further include a third metallic bar disposed on the first outer surface, the third metallic bar being separated from each of the first metallic bar and the second metallic bar in the second direction. Each of the first metallic bar, the second metallic bar, and third metallic bar are optionally part of a different respective electrical node of the circuit assembly.

(A9) In any one of the circuit assemblies denoted as (A2) through (A8), the first substrate may include a second outer surface opposite of the first outer surface in the first direction, and the circuitry assembly may further include an electrical load disposed on the second outer surface, the electrical load being electrically coupled to each of the first metallic bar and the first component.

(A10) In the circuit assembly denoted as (A9), the electrical load may include an integrated circuit disposed on the second outer surface over the first metallic bar in the first direction.

(A11) Any one of the circuit assemblies denoted as (A9) and (A10) may further include at least one row of a plurality of inductors disposed on the second outer surface, each of the plurality of inductors of each row being electrically coupled to the first metallic bar.

(A12) The circuit assembly denoted as (A2) may further include a second substrate disposed over the first substrate in the first direction.

(A13) The circuit assembly denoted as (A12) may further include an electrical load disposed on the second substrate, the electrical load being electrically coupled to each of the first metallic bar and the first component.

(A14) In the circuit assembly denoted as (A13), the electrical load may include an integrated circuit disposed on the second substrate over the first metallic bar in the first direction.

(A15) Any one of the circuit assemblies denoted as (A12) through (A14) may further include at least one inductor disposed on the second substrate, the at least one inductor being electrically coupled to the first metallic bar.

(A16) The circuit assembly denoted as (A3) may further include (1) a second substrate disposed over each of the first and second metallic bars in the first direction, such that each of the first and second metallic bars is disposed between the first substrate and the second substrate in the first direction, and (2) a third metallic bar disposed on an outer surface of the second substrate.

(A17) In any one of the circuit assemblies denoted as (A1) through (A16), the first component may be a capacitor.

(B1) A circuit assembly may include (1) a printed circuit board (PCB) including a plurality metallic layers separated from each other in a first direction by a plurality of insulating layers, the PCB including opposing first and second outer surfaces separated from each other in the first direction, (2) an integrated circuit disposed on the second outer surface, (3) a plurality of capacitors disposed on the first outer surface under the integrated circuit in the first direction, each of the plurality of capacitors being electrically coupled to the integrated circuit, and (4) a plurality of metallic bars disposed on the first outer surface under the integrated circuit in the first direction, each of the plurality of metallic bars being electrically coupled to the integrated circuit.

(B2) In the circuit assembly denoted as (B1), the plurality of capacitors may be arranged in a plurality rows of capacitors, and adjacent rows of the plurality of rows of capacitors may be separated from each other by a respective metallic bar of the plurality metallic bars, in a second direction that is orthogonal to the first direction.

(B3) In any one of the circuit assemblies denoted as (B1) and (B2), each of the plurality of capacitors may have a respective capacitor thickness in the first direction, each of the plurality of metallic bars may have a respective bar thickness in the first direction, and each bar thickness may be greater than each capacitor thickness.

(B4) Any one of the circuit assemblies denoted as (B1) through (B3) may further include a pressure plate, each of the plurality of capacitors and each of the plurality of metallic bars may be disposed between the pressure plate and the PCB in the first direction.

(B5) In the circuit assembly denoted as (B4), the pressure plate may be formed of metal, and the circuit assembly may further include an isolation layer disposed between (1) the pressure plate, and (2) each of the plurality of capacitors and each of the plurality of metallic bars, in the first direction.

(B6) Any one of the circuit assemblies denoted as (B1) through (B3) may further include molding material disposed on each of the plurality of capacitors and each of the plurality of metallic bars.

(B7) Any one of the circuit assemblies denoted as (B1) through (B6) may further include at least one of row of a plurality of inductors disposed on the second outer surface, each of the plurality of inductors of each row being electrically coupled to one or more of the plurality of metallic bars.

(C1) A circuit assembly may include (1) a first substrate including a first outer surface, (2) a first metallic bar disposed on the first outer surface, (3) a second metallic bar disposed on the first outer surface, the second metallic bar being separated from the first metallic bar in a first direction, and (4) a first component disposed between the first and second metallic bars in the first direction, the first component including a first terminal and a second terminal, the first terminal being electrically coupled to the first metallic bar, and the second terminal being electrically coupled to the second metallic bar.

(C2) In the circuit assembly denoted as (C1), the first component may include a first capacitor.

(C3) In any one of the assemblies denoted as (C1) and (C2), the first substrate may include a second outer surface opposite of the first outer surface in a second direction that is orthogonal to the first direction, and the circuitry assembly may further include an electrical load disposed on the second outer surface, the electrical load being electrically coupled to each of the first metallic bar and the first component.

(C4) In the assembly denoted as (C3), the electrical load may include an integrated circuit disposed on the second outer surface over the first metallic bar in the second direction.

(C5) In any one of the assemblies denoted as (C1) through (C4), the first component may have a component thickness in a second direction that is orthogonal to the first direction, each of the first and second metallic bars may have a respective bar thickness in the second direction, and each bar thickness may be greater than the component thickness.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A circuit assembly, comprising:
a first substrate including a first outer surface;
a first component disposed on the first outer surface, the first component having a first component thickness in a first direction orthogonal to the first outer surface;
a first metallic bar disposed on the first outer surface, the first metallic bar having a first bar thickness in the first direction where the first bar thickness is greater than the first component thickness such that the first metallic bar is thicker than the first component;
a second metallic bar disposed on the first outer surface, the second metallic bar being separated from the first metallic bar in a second direction orthogonal to the first direction, wherein the first component is disposed between the first and second metallic bars in the second direction; and
a third metallic bar disposed on the first outer surface, the third metallic bar being separated from each of the first metallic bar and the second metallic bar in the second direction.

2. The circuit assembly of claim 1, wherein:
the first component includes a first terminal and a second terminal;
the first terminal is electrically coupled to the first metallic bar; and
the second terminal is electrically coupled to the second metallic bar.

3. The circuit assembly of claim 1, wherein each of the first and second metallic bars is an extension of a respective winding of an inductor.

4. The circuit assembly of claim 1, further comprising a pressure plate, each of the first metallic bar, the second metallic bar, the third metallic bar, and the first component being disposed between the first substrate and the pressure plate in the first direction.

5. The circuit assembly of claim 1, wherein:
the first substrate further includes a second outer surface opposite of the first outer surface in the first direction; and
the circuitry assembly further comprises an electrical load disposed on the second outer surface, the electrical load being electrically coupled to at least each of the first metallic bar and the first component.

6. The circuit assembly of claim 5, wherein the electrical load includes an integrated circuit disposed on the second outer surface over the first metallic bar in the first direction.

7. The circuit assembly of claim 6, further comprising at least one row of a plurality of inductors disposed on the second outer surface, each of the plurality of inductors of each row being electrically coupled to at least the first metallic bar.

8. The circuit assembly of claim 1, wherein the first component is a capacitor.

9. A circuit assembly, comprising:
a printed circuit board (PCB) including a plurality metallic layers separated from each other in a first direction by a plurality of insulating layers, the PCB including opposing first and second outer surfaces separated from each other in the first direction;
an integrated circuit disposed on the second outer surface;
a plurality of capacitors disposed on the first outer surface under the integrated circuit in the first direction, each of the plurality of capacitors being electrically coupled to the integrated circuit, each of the plurality of capacitors having a respective capacitor thickness in the first direction;
a first metallic bar disposed on the first outer surface under the integrated circuit in the first direction, the first metallic bar being electrically coupled to the integrated circuit, the first metallic bar having a first bar thickness in the first direction where the first bar thickness is greater than each capacitor thickness such that the first metallic bar is thicker than each capacitor of the plurality of capacitors;
a second metallic bar disposed on the first outer surface, the second metallic bar being separated from the first metallic bar in a second direction orthogonal to the first direction, at least one capacitor of the plurality of capacitors being disposed between the first and second metallic bars in the second direction; and a third metallic bar disposed on the first outer surface, the third metallic bar being separated from each of the first metallic bar and the second metallic bar in the second direction.

10. The circuit assembly of claim 9, further comprising a pressure plate, each of the plurality of capacitors, the first metallic bar, the second metallic bar, and the third metallic bar being disposed between the pressure plate and the PCB in the first direction.

11. A circuit assembly, comprising:
a first substrate including a first outer surface;
a first metallic bar disposed on the first outer surface, the first metallic bar having a first bar thickness in a first direction orthogonal to the first outer surface;
a second metallic bar disposed on the first outer surface, the second metallic bar being separated from the first metallic bar in a second direction orthogonal to first direction;
a first component disposed between the first and second metallic bars in the second direction, the first component including a first terminal and a second terminal, the first terminal being electrically coupled to the first metallic bar, the second terminal being electrically coupled to the second metallic bar, the first component having a first component thickness in the first direction that is less than the first bar thickness such that the first metallic bar is thicker than the first component; and
a third metallic bar disposed on the first outer surface, the third metallic bar being separated from each of the first metallic bar and the second metallic bar in the second direction.

12. The circuit assembly of claim 11, wherein the first component comprises a first capacitor.

13. The circuit assembly of claim 11, wherein:
the first substrate includes a second outer surface opposite of the first outer surface in the first direction; and
the circuitry assembly further comprises an electrical load disposed on the second outer surface, the electrical load being electrically coupled to at least each of the first metallic bar and the first component.

14. The circuit assembly of claim 13, wherein the electrical load includes an integrated circuit disposed on the second outer surface over the first metallic bar in the first direction.

15. The circuit assembly of claim 11, wherein:
the second metallic bar has a second bar thickness in the first direction; and
the second bar thickness is greater than the first component thickness.

* * * * *